(12) United States Patent
Kariyazaki et al.

(10) Patent No.: US 9,035,450 B2
(45) Date of Patent: May 19, 2015

(54) SEMICONDUCTOR DEVICE AND INTERCONNECT SUBSTRATE

(71) Applicant: Renesas Electronics Corporation, Kawasaki-shi (JP)

(72) Inventors: Shuuichi Kariyazaki, Kawasaki (JP); Ryuichi Oikawa, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 4 days.

(21) Appl. No.: 14/242,462

(22) Filed: Apr. 1, 2014

(65) Prior Publication Data

US 2014/0300003 A1    Oct. 9, 2014

(30) Foreign Application Priority Data

Apr. 9, 2013 (JP) ................................. 2013-081064

(51) Int. Cl.
*H01L 23/12* (2006.01)
*H01L 23/053* (2006.01)
*H01L 23/522* (2006.01)

(52) U.S. Cl.
CPC .................................. *H01L 23/5222* (2013.01)

(58) Field of Classification Search
CPC ........... H01L 2924/01078; H01L 2924/15311; H01L 2924/01079
USPC .................... 257/E23.011, E23.036, E23.151, 257/E23.175, 678, 698, 700–702, 773–775, 257/750, 760; 438/106, 121, 125; 361/761, 361/811; 174/250, 260
See application file for complete search history.

(56) References Cited

U.S. PATENT DOCUMENTS

| | | | | |
|---|---|---|---|---|
| 6,545,353 | B2* | 4/2003 | Mashino | 257/724 |
| 6,876,091 | B2* | 4/2005 | Takeuchi et al. | 257/793 |
| 7,339,260 | B2* | 3/2008 | Sugimoto et al. | 257/668 |
| 7,473,988 | B2* | 1/2009 | Urashima et al. | 257/668 |
| 7,605,460 | B1* | 10/2009 | Wu et al. | 257/691 |
| 2005/0217893 | A1* | 10/2005 | Noguchi et al. | 174/250 |
| 2006/0175083 | A1* | 8/2006 | Muramatsu et al. | 174/260 |
| 2011/0063811 | A1* | 3/2011 | Kariya et al. | 361/761 |

FOREIGN PATENT DOCUMENTS

| | | |
|---|---|---|
| JP | 2006-049645 A | 2/2006 |
| JP | 2012-209340 A | 10/2012 |

* cited by examiner

*Primary Examiner* — Chris Chu
(74) *Attorney, Agent, or Firm* — McGinn IP Law Group, PLLC

(57) ABSTRACT

A semiconductor substrate includes a semiconductor chip and an interconnect substrate. The interconnect substrate has an interconnect region between a first main surface formed with plural orderly arranged first and second signal electrodes connected to the semiconductor chip, and a second main surface. The interconnect region has a core substrate, interconnect layers formed on both surfaces thereof, plural first through holes and plural first vias that pass through the interconnect layer on the side of the first main surface for forming impedance matching capacitances. Each first through hole is connected to a first signal interconnect at a position spaced part from the first signal electrode by a first interconnect length and each first via is connected to the second signal interconnect at a position spaced apart from the second signal electrode by a second interconnect length that is substantially equal with the first interconnect length.

20 Claims, 26 Drawing Sheets

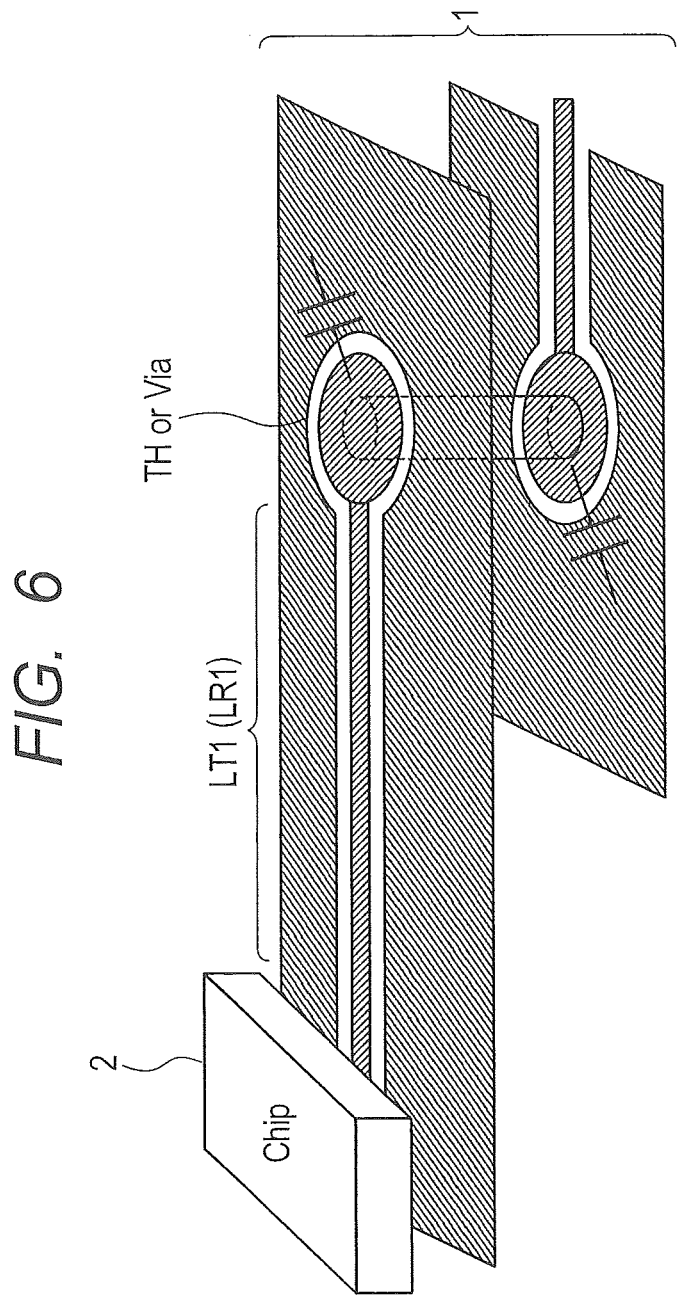

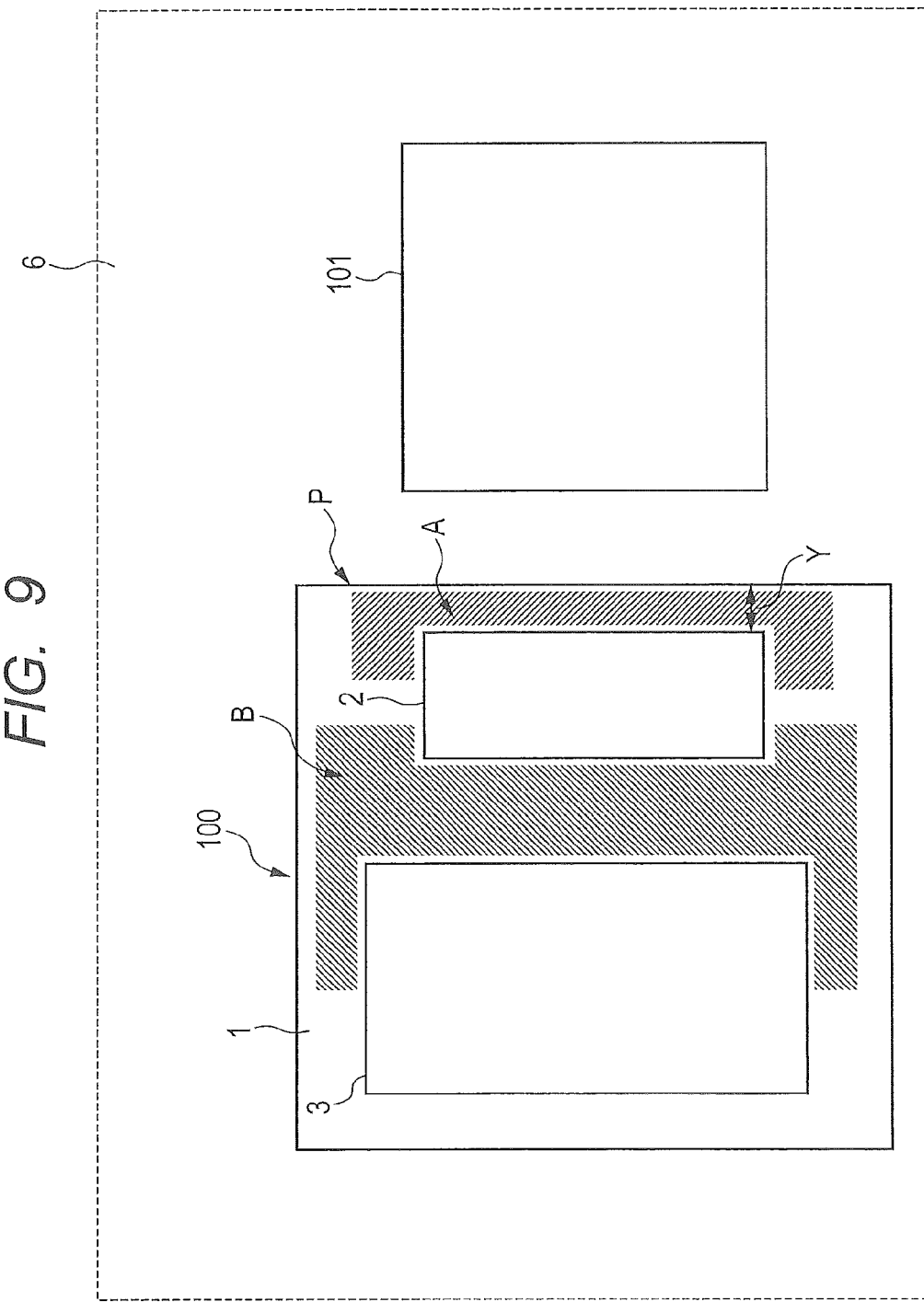

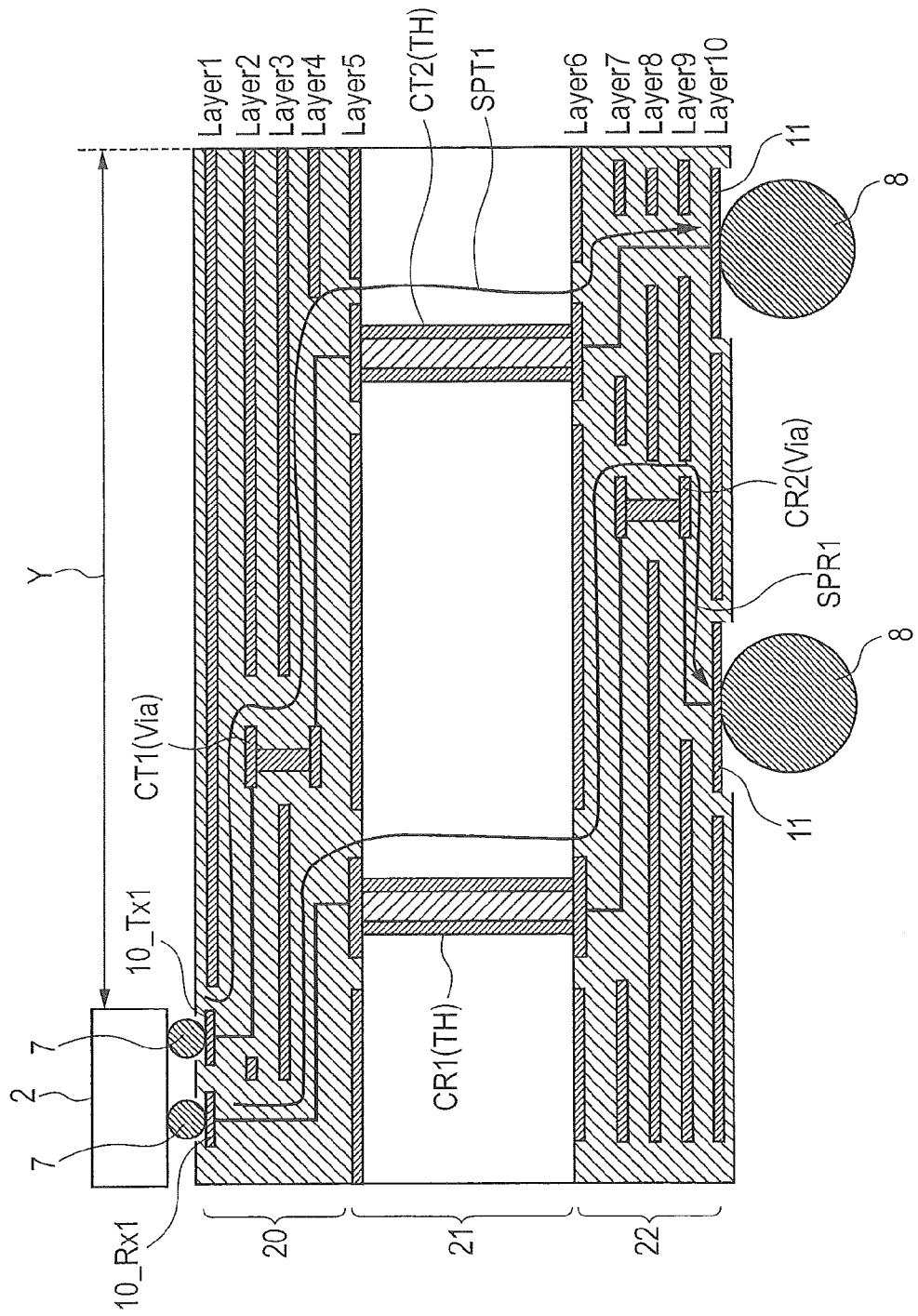

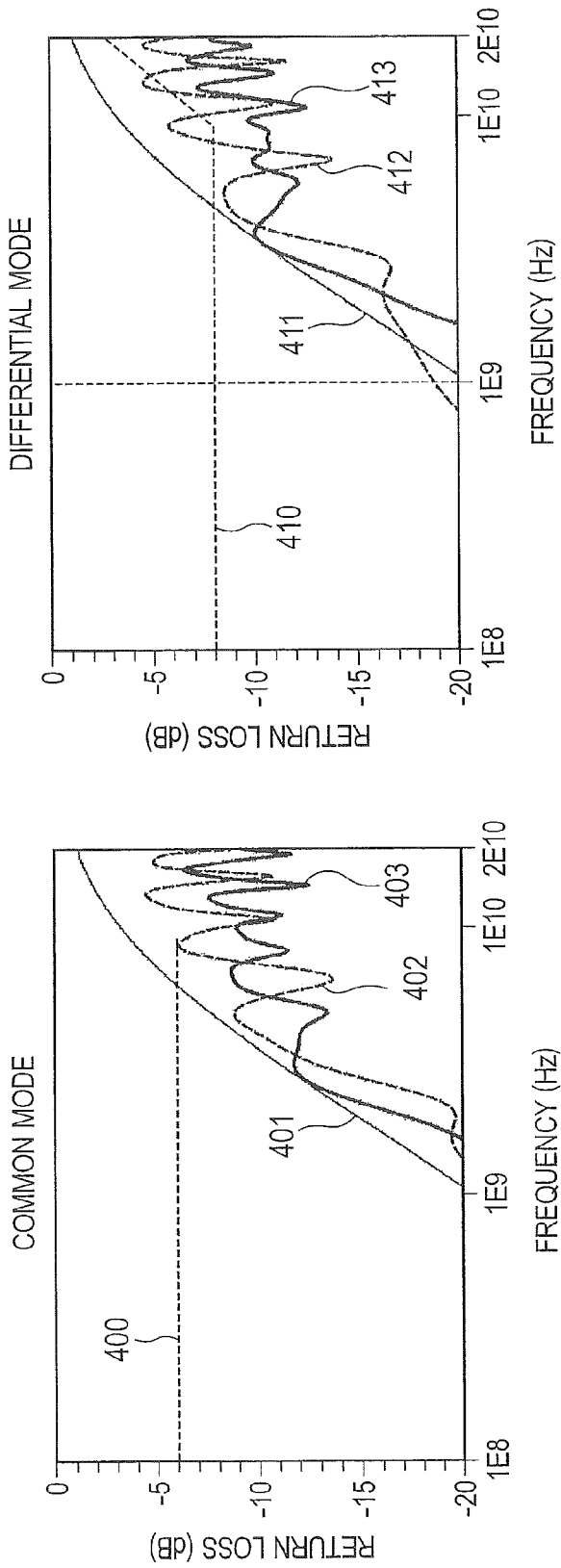

SEMICONDUCTOR DEVICE AND INTERCONNECT SUBSTRATE

CROSS-REFERENCE TO RELATED APPLICATIONS

The disclosure of Japanese Patent Application No. 2013-081064 filed on Apr. 9, 2013 including the specification, drawings, and abstract is incorporated herein by reference in its entirety.

BACKGROUND

The present invention relates to a semiconductor device and an interconnect substrate and it particularly relates to a technique which is effective when applied to a semiconductor device capable of high speed communication.

In recent years, a communication speed in network communication has been increased more and a signal transmission speed exceeding 10 Gbps has been used generally in network equipment. Accordingly, signal reflection by parasitic capacitance of interface buffers (I/O devices) of communication semiconductor devices (LSI: large scale integrated circuits) mounted on the network equipment deteriorates signal quality, which imposes a significant problem. This is considered to be attributable to that the admittance of the parasitic capacitance increases more as the operation frequency of the I/O device is higher, which greatly lowers the input/output impedance of the I/O device to result impedance mismatching between the I/O device and the signal transmission line. For example, it is assumed a case that an I/O device having a parasitic capacitance on the output side and an I/O device having a parasitic capacitance on the input side are connected by way of a signal transmission line having a characteristic impedance of 50Ω. In this case, even when each of the input resistance of the I/O device on the input side and the output resistance of the I/O device on the output side is defined theoretically at 50Ω, the admittance of the parasitic capacitance of the I/O device on the input side and that on the output side increase as the frequency of the transmitted signal is higher, which lowers the input impedance of the I/O device on the input side and the output impedance of the I/O device on the output side. For example, when the parasitic capacitance of the I/O device on the input side and that on the output side is 1 pF, the input/output impedance of each of the I/O devices is about 45Ω at 1.25 GHz, about 25Ω at 3.2 GHz (corresponding to 6.4 Gbps), and about 14Ω at 5.0 GHz (corresponding 10 Gbps). Lowering of the input/output impedance of the I/O device causes remarkable impedance mismatching between the signal transmission line and the I/O device to greatly distort the signal waveform.

For mitigating the effect of the parasitic capacitance of the I/O device, it has been known so far a technique of forming an impedance matching circuit on a semiconductor chip in which the I/O device is formed, or burying an inductor (L), a capacitor (C), and a resistor (R) in an interconnect substrate of a semiconductor substrate (packaging substrate) for mounting the semiconductor chip, thereby compensating the impedance mismatching. In addition, an existent technique of decreasing the distortion of the waveform caused by impedance mismatching is disclosed as a relevant technique, for example, in Japanese Patent Laid-Open Nos. 2006-49645 and 2012-209340. Japanese Unexamined Patent Application Publication No. 2006-49645 discloses a configuration of disposing plural through holes for grounding interconnect around a signal through hole in a printed substrate. Japanese Unexamined Patent Application Publication No. 2012-209340 discloses a configuration of a signal transmission line which is formed including through via holes (through holes) for connecting an outer layer pattern and an inner layer pattern of a multilayer substrate where buried via holes are disposed at a position adjacent to the through via hole with an insulator being put between them.

SUMMARY

However, the method of forming the impedance matching circuit over the semiconductor device described above involves a problem of increasing the area of the semiconductor chip. Particularly, when signals in multiple channels are used, since a matching circuit is necessary for every I/O device of each channel, this remarkably increases the chip area and is not practical. Further, the method of burying the inductor, the capacitor, or the like in the interconnect substrate of the semiconductor package involves a problem that manufacture of the interconnect substrate is difficult to increase the cost.

Prior to the filing of the present application, the present inventors have studied on the formation of an impedance matching circuit in an interconnect substrate of a semiconductor package by utilizing a through hole in the interconnect substrate. Specifically, a through via that forms a parasitic capacitance as the impedance matching circuit is disposed at a position spaced apart from the I/O terminal end by $\lambda/4$ of the signal frequency to a signal transmission line connected to the I/O device on the interconnect substrate. In this configuration, a signal inputted to the I/O device is reflected by the parasitic capacitance of the I/O device terminal and the reflection wave is reflected again by the parasitic capacitance of the through hole and returned being displaced by $\lambda/2$ in view of the phase to the I/O device terminal end. As a result, the reflection wave reflected by the parasitic capacitance of the I/O terminal and the reflection wave reflected by the parasitic capacitance of the through hole are offset to each other to improve the signal characteristics (for example, return loss characteristic) of signals in the signal transmission line.

When the technique described above is applied to a semiconductor device that uses signals of multiple channels, since the through hole as an impedance matching circuit is formed for every signal transmission line of each channel, a wide region is required for forming plural through holes to the interconnect substrate. Particularly, in a case of a differential signal line pair, since through holes connected to a ground potential have to be disposed so as to surround the through hole as the impedance matching circuit connected to the differential signal line in order to propagate the differential signals from the upper layer to the lower layer a wide region is required on the interconnect substrate. However, in a semiconductor device encapsulating plural semiconductor chips in one semiconductor package such as SiP (system in a package), since the interconnect density or the via density of the packaging substrate are high, it is not easy to ensure a sufficient region to form the through holes described above. For example, in a SiP where plural semiconductor chips are mounted, interconnects, through holes, and vias for electrically connecting the semiconductor chips to each other are formed densely in a region between one semiconductor chip and another semiconductor chip connected therewith (for example, in a central area of the interconnect substrate). On the other hand, interconnects, through holes, and vias for connecting a semiconductor chip and an external terminal (external bump) (for example, interconnects, vias, etc. for electrically connecting I/O devices on the semiconductor chip and external bumps) are densely formed to the outer periphery of the semiconductor chip in the packaging substrate, that is, in a narrow area from the end of the semiconductor chip to the end of the packaging substrate. When the through holes as the impedance matching circuits are disposed in the signal transmission line for connecting the I/O device and the external bump, since they have to be formed in the narrow region as described above, it becomes more difficult to ensure a region for forming the through holes as the number of I/O devices increases. Particularly, when most of the I/O devices transmit signals in an identical frequency band, since the through holes are formed densely at positions of an identical distance from the I/O terminal end (for example, positions spaced apart by $\lambda/4$ of the signal frequency), arrangement of the interconnects (routing) is difficult. Accordingly, it is necessary to provide a countermeasure such as increase of the size of the packaging substrate to result in increase of the manufacturing cost. The techniques of Japanese Unexamined Patent Application Publication Nos. 2006-049645 and 2012-209340 are adapted to control the parasitic capacitance (impedance) of the through hole included in the signal transmission line but not to positively dispose the through holes in the signal transmission line for improving the signal characteristics and no particular consideration is made for ensuring a region for disposing plural through holes.

Means for solving such subjects are to be described below. Other subjects and novel features will become apparent in view of the description of the specification and the appended drawings.

The outline of typical embodiments among those disclosed in the present invention will be simply described below.

According to an aspect of the present invention, a semiconductor device has a semiconductor chip and an interconnect substrate in which the semiconductor chips are mounted. The interconnect substrate has a first main surface in which plural first electrodes connected electrically to the semiconductor chip, a second main surface opposing the first main surface, and an interconnect region interposed between the first main surface and the second main surface. The first electrode includes plural first signal electrodes and second signal electrodes disposed orderly for receiving supply of signals at a predetermined frequency. The first signal electrodes and the second signal electrodes are disposed being dispersed in the arrangement thereof. The interconnect region has a core substrate, plural interconnect layers formed respectively on both surfaces of the core substrate, and plural first through holes that pass through the core substrate for forming an impedance matching capacitances. The interconnect region further has plural first vias that pass through the interconnect layer formed to the core substrate on the side of the first main surface for forming impedance matching capacitances. The interconnect region further includes plural first signal interconnects connected to the corresponding first signal electrodes and plural second signal interconnects connected to the corresponding second signal electrodes.

The first through hole is connected to the first signal interconnect at a position spaced apart from the first signal electrode by a first interconnect length, and the first via is connected to the second signal interconnect at a position spaced apart from the second signal electrode by a second interconnect length substantially equal with the first interconnect length.

Advantageous effects obtained by typical embodiments, among those disclosed in the present application will be simply described below.

According to the aspect of the invention, the semiconductor device may attain good signal transmission characteristics while suppressing a manufacturing cost.

BRIEF DESCRIPTION OF THE DRAWINGS

FIG. 6 is a schematic view illustrating a matching circuit formed to a packaging substrate;

FIG. 9 is a plan view of the semiconductor device;

FIG. 10 is a schematic cross sectional view of the packaging substrate in which through holes and vias as matching circuits are formed;

FIG. 23A is a view illustrating transmission characteristics of a differential signal line SNDR in a common mode in a case of forming a matching circuit CR1 in a first stage with a through hole and forming a matching circuit CR2 in a second stage with a via;

FIG. 23B is a view illustrating transmission characteristics of a differential signal line SNDR in a differential mode in a case of forming a matching circuit CR1 in a first stage by a through hole and forming a matching circuit CR2 in a second stage with a via;

Figure 1:
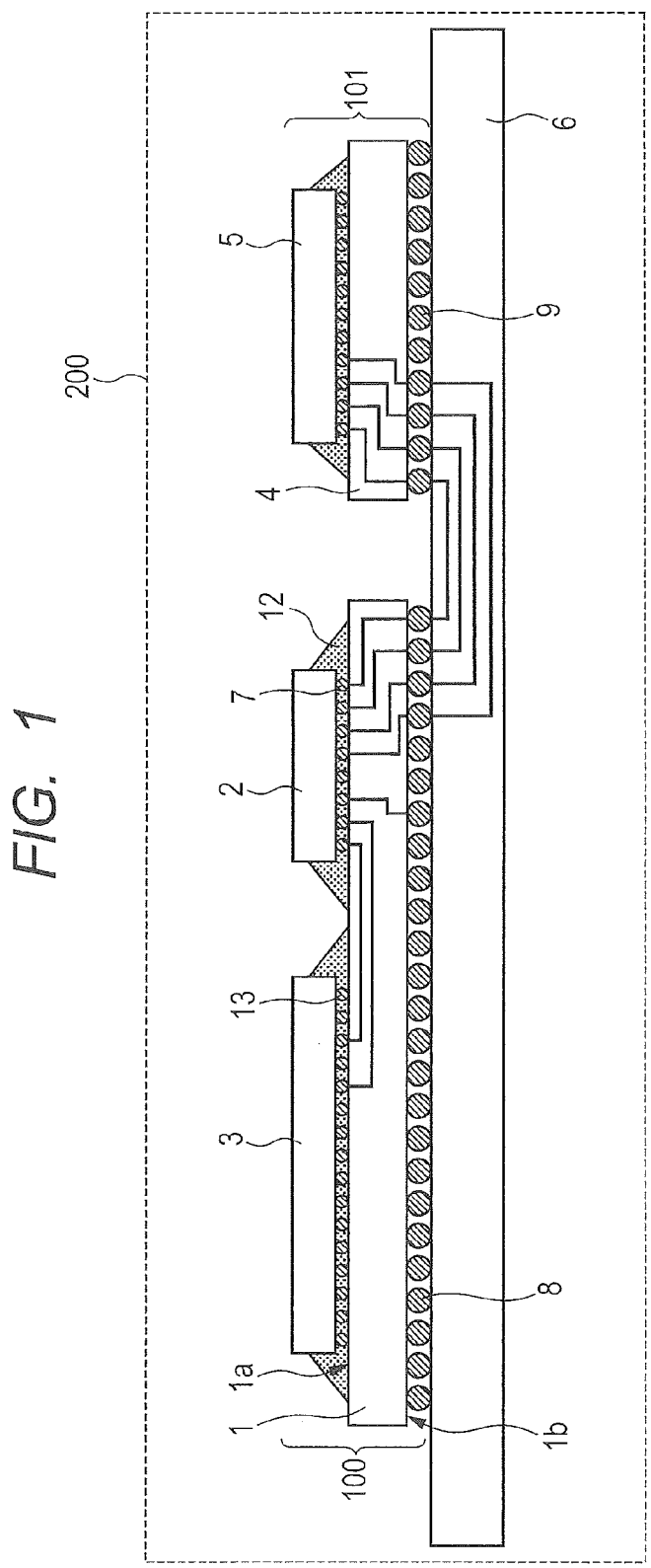
FIG. 1 is an entire schematic cross sectional view of an electronic circuit in which a semiconductor device according to an embodiment of the invention is mounted.

DETAILED DESCRIPTION (1) Outline of an Embodiment

At first, an outline of a typical embodiment disclosed in the present application is to be described. Each bracketed reference sign in the drawing referred to in the outlined explanation of typical embodiments merely exemplifies a member or component included in the concept of a constituent element to which a bracket is attached.

[1] (Semiconductor Device Having a Packaging Substrate in which Through Holes and Vias as Matching Circuits are Arranged Each within a Predetermined Range from a Semiconductor Chip)

A semiconductor device according to a typical embodiment of the invention has a semiconductor chip (2) and an interconnect substrate (1) on which the semiconductor chip is mounted. The interconnect substrate (1) has a first main surface (1a) on which plural first electrodes (10) electrically connected with the semiconductor chip are formed, a second main surface (1b) opposing the first main surface (1a), and an interconnect region interposed between the first main surface (1a) and the second main surface (1b). The first electrode includes plural first signal electrodes (10_Rx) and second signal electrodes (10_Tx) for receiving supply of the signals at a predetermined frequency. The first signal electrodes and the second electrodes are arranged being dispersed in the arrangement thereof. The interconnect region has a core substrate (21), plural interconnect layers (20, 22) formed on both surfaces of the core substrate 21 respectively and plural first through holes (CR1) that pass through the core substrate for forming an impedance matching capacitance. Further, the interconnect region has plural first vias (CT1) that pass through the interconnect layer formed to the core substrate on the side of the first main surface for forming impedance matching capacitances. Further, the interconnect region includes plural first signal interconnects (SNR1 to SNRm) connected to the corresponding first signal electrode and plural second signal interconnects (SNT1 to SNTn) connected to the corresponding second signal electrode. The first through hole is connected with the first signal interconnect at a position spaced apart from the first signal electrode by a first interconnect length (LR1), and the first via is connected with the second signal interconnect at a position spaced apart from the second interconnect length (LT1≈LR1) substantially identical with the first interconnect length.

With the constitution described above, in the interconnect substrate, plural through holes and vias for impedance matching capacitances (hereinafter referred to as matching circuits) are formed in different layers in the interconnection region. Thus more matching circuits can be formed at a higher density compared with a case of forming the matching circuits only with the through holes. Further, since the through holes and vias as the matching circuits are formed in different layers, interconnects connected to them respectively can be routed easily to lower the interconnect density. Further, the first vias as the matching circuit can be formed by a production process identical with that for usual vias. Therefore, according to the semiconductor device of the invention, good signal transmission characteristics can be attained while suppressing the manufacturing cost of the interconnect substrate (packaging substrate).

[2] (Matching Circuits Connected in Multi-Stage)

In the semiconductor device described in paragraph (1) above, the interconnect region further includes plural second through holes (CT2) that pass through the core substrate for forming an impedance matching capacitance and plural second vias (CR2) that pass through the interconnect layer formed to the core substrate on the side of the second main surface. The second through hole is connected with the second signal interconnect at a position spaced apart from the second signal electrode by a third interconnect length (LR2) longer than the first interconnect layer and the second via is connected with the first signal interconnect at a position spaced apart from the first signal electrode by a fourth interconnect length (LT2≈LR2) which is substantially equal with the third interconnect length.

According to the configuration, plural matching circuits are formed to the first signal interconnect connected to the first signal electrode. In the same manner, plural matching circuits are formed to the second signal interconnect connected to the second signal electrode. Thus, signal characteristics can be improved in a wider frequency region. Further, by forming the matching circuit in the second stage connected to the first signal interconnect by a via and forming the matching circuit in the second stage connected to the second signal interconnect by a through hole, matching circuits can be formed at a higher density and the interconnect density can be lowered.

[3] (Correction Circuit in the First Stage is Formed at a Position Near λ/4)

In the semiconductor device described in the paragraph (2) above, the first interconnect length is a length corresponding to ¼ of an electromagnetic wave length (λa, λc) corresponding to first frequency (fa, fc) in a signal band required for the signal transmission line.

According to the configuration, distortion of a signal waveform by a reflection signal reflected by the first signal interconnect end (second signal interconnect end) on the side of the first signal electrode (on the side of the second signal electrode) can be decreased further.

[4] (Correction Circuit in the Second Stage is Formed at a Position Near 3λ/4)

In the semiconductor device described in the paragraph (2) or (3), the third interconnection length is a length corresponding to ¾ of electromagnetic wavelength (λb, λd) in accordance with second frequency (fb, fd) different from the first frequency in the signal band required for the signal transmission line.

The phase of the reflection signal reflected at the matching circuit and returned to the first signal electrode (second signal electrode) is identical as π (180 degree) between a case in which the matching circuit is disposed at a position spaced apart by ¼ of the electromagnetic wavelength in accordance with the second frequency and a case in which the matching circuit is disposed at a position spaced apart by ¾ of the electromagnetic wavelength from the first signal electrode (second signal electrode). Accordingly, the same effect is expected by disposing the matching circuit at a position of ¾ of the electromagnetic wavelength as in the case of disposing the matching circuit at a position of ¼ of the electromagnetic wavelength. According to the semiconductor device of the invention, since the matching circuit in the first stage (for example, the first through hole) and the matching circuit in the second stage (second via) are formed at spaced apart positions, a region for forming the matching circuit in the second stage can be ensured easily and the density of the matching circuits can be increased and the interconnect density can be decreased further. This is effective when applied, particularly, to a case where the value of the first frequency is close to that of the second frequency and it is difficult to dispose both of the matching circuits in the first stage and the second stage at positions of ¼ of the electromagnetic wavelength.

[5] (Correction Circuit in the First Stage is Formed at a Position Near 3λ/4)

In the semiconductor device described in the paragraph (2), the first interconnect length is a length corresponding to ¾ of the electromagnetic wavelength (λa, λc) in accordance with the first frequency (fa, fc) in the signal band required for the signal transmission line.

As described above, when the matching circuit is disposed at a position of ¾ of the electromagnetic wavelength, since the effect identical with that of the circuit when disposed at a position of ¼ of the electromagnetic wavelength, distortion of the signal waveform can be decreased more in the same manner as in the item 3.

[6] (Through Hole and Via do not Overlap)

In the semiconductor device in any one of the items 2 to 5, the first through hole and the first via do not overlap in a plan view.

According to this configuration, interference between the first signal interconnect and the second signal interconnect by decoupling of the first through hole and the first via can be suppressed, thereby contributing to the attainment of good signal transmission characteristics.

[7] (Differential Interconnect Pair)

In the semiconductor device described in any one of the items 2 to 6, the first signal interconnect is a first differential interconnect pair in which two interconnects are formed in parallel (SNDR), and the second signal interconnect is a second differential interconnect pair in which two interconnects are formed in parallel (SNDT).

[8] (Tx, Rx)

In the semiconductor device described in any one of the items 1 to 7, one of the first signal electrode and the second signal electrode is a receiving electrode for inputting a signal to the semiconductor chip and the other of them is a transmitting electrode for outputting a signal from the semiconductor chip.

Figure 7C:
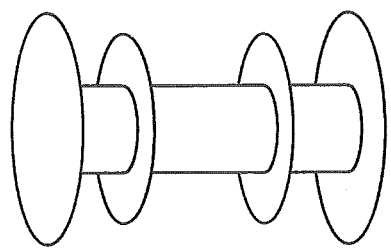
FIG. 7C shows an example of a third shape of the land connected to the through hole for forming the matching circuit.
Figure 7B:
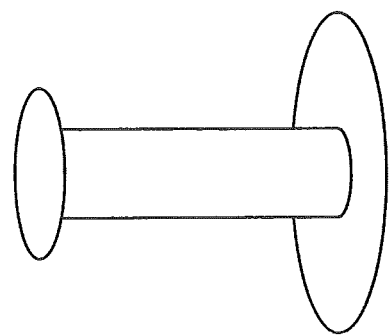
FIG. 7B shows an example of a second shape of the land connected to the through hole for forming a matching circuit.

[9] (Shape of Through Hole; Upper/Lower Land Diameters are Different: FIG. 7B)

In the semiconductor device described in any one of the paragraphs (1) to (8), the diameter of the uppermost land and the diameter of the lowermost land connected to the first through hole are different in a cross sectional view.

According to the configuration, coupling between the first through hole and the interconnect of the upper and lower layers in adjacent therewith can be decreased, for example, by increasing the diameter of a land adjacent to a layer on the side where the interconnect density is low and decreasing the diameter of a land adjacent to a layer on the side where the interconnect density is high.

[10] (Shape of Through Hole: Multiple Land; FIG. 7C)

In the semiconductor device described in any one of the items 1 to 8, plural lands are connected in the vertical direction to the first through hole in a cross sectional views.

According to the configuration, since the number of lands that form the parasitic capacitance is increased, the diameter of the land per one land for obtaining a necessary capacitance value can be decreased, and the density of the matching circuit can be increased and the interconnect density can be decreased further.

[11] (Shape of Via: Diameters of Upper/Lower Lands are Different: FIG. 8B, FIG. 8D)

In the semiconductor device described in any one of the items 1 to 10, the diameter of the uppermost land connected to the first via and the diameter of the lowermost land connected to the first via are different in a cross sectional view.

According to the configuration, coupling between the first via and the interconnects of the upper and lower layers adjacent therewith can be decreased, for example, by increasing the diameter of the land in adjacent to a layer on the side where the interconnect density is lower and decreasing the diameter of the land adjacent to the layer on the side where the interconnect density is higher.

[12] (Shape of Via: Multiple Land: FIG. 8C, FIG. 8D)

In the semiconductor device described in any one of the items 1 to 10, plural lands are connected to the first via in the vertical direction in the cross sectional view.

According to the configuration, since the number of the lands that form the parasitic capacitances is increased, the diameter of the land per one land for obtaining a necessary capacitance value can be decreased, and the density of the matching circuits can be increased and the interconnect density can be decreased further.

[13] (Via Interconnect: Connected to Identical Interconnect Layer; Combination of FIG. 11A to FIG. 11C)

Figure 11C:
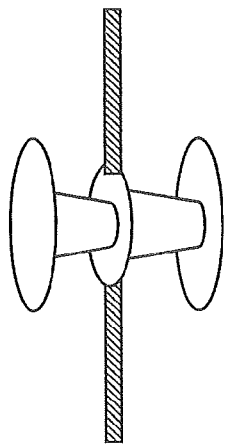
FIG. 11C shows a third connection example of the interconnect to the via for forming the matching circuit.
Figure 11B:
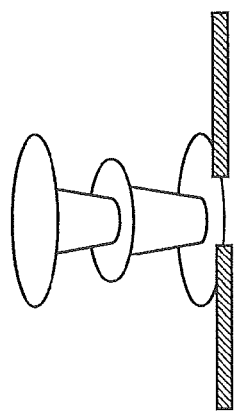
FIG. 11B shows a second connection example of the interconnect to the via for forming the matching circuit.
Figure 11A:
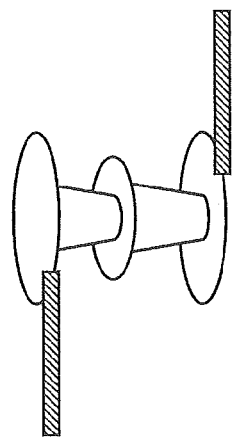
FIG. 11A shows a first connection example of an interconnect to a via for forming a matching circuit.

In the semiconductor device described in any one of the items 1 to 12, a portion of the plural first vias is connected by way of one land to the second signal interconnect (FIG. 11B and FIG. 11C), and the remaining portion is connected by way of plural lands to the second signal interconnect (FIG. 11A).

According to the configuration, since the plural interconnects to be connected to the respective first vias can be dispersed in plural interconnect layers, the interconnect density can be decreased further.

[14] (First Via>Second Via)

In the semiconductor device described in any one of the items 2 to 13, the land diameter of the first via is made larger than that of the second via.

The level of the reflection signal reflected at the first signal interconnect end (second signal interconnect end) on the side of the first signal electrode (on the side of the second signal electrode) is lower as the distance from the first signal electrode (second signal electrode) is larger. Accordingly, in the matching circuit in the second stage formed at a position spaced apart farther from the first signal electrode (second signal electrode) than the matching circuit in the first stage, even when the capacitance value is made smaller than that in the first stage, a sufficient effect to offset the reflection wave reflected at the first signal interconnect end (second signal interconnect end) can be obtained. Accordingly, density of the matching circuit can be increased and the interconnect density can be decreased further without decreasing the effect of suppressing the distortion of the signal waveform by the reflection wave by decreasing the capacitance value of the matching circuit in the second stage compared with that of the matching circuit in the first stage as in the semiconductor device of the invention.

[15] (First Via Larger than Usual Via)

In the semiconductor device described in any one of the items 1 to 14, the diameter of the land of the first via is made larger than that of the via for connecting adjacent interconnect layers.

According to the configuration, since the parasitic capacitance of the first via is larger than that of the usual via, it can function easily as the matching circuit.

[16] (Interface Buffer)

In the semiconductor device described in any one of the items 1 to 15, the semiconductor chip has plural interface buffers (Tx1 to Txn, and Rx1 to Rxm) which are connected corresponding to the first signal terminal and the second signal terminal respectively.

According to the configuration, signal characteristics of the interface buffer can be improved due to the configurations of the items 1 to 15.

[17] (External Terminal: BGA)

The semiconductor device described in any one of the items 1 to 16 further has plural external terminals (8). The second main surface has plural second electrodes (11) electrically connected to the corresponding external terminals. The first signal interconnect forms a transmission line that electrically connects the first signal electrode and the corresponding second electrode and the second signal interconnect forms a transmission line that electrically connects the second signal electrode and the corresponding second electrode.

According to the configuration, signal transmission characteristics of the transmission line from the semiconductor chip to the external terminal in the interconnect substrate can be improved.

[18] (Interconnect Substrate)

The interconnect substrate (1) according to a typical embodiment of the invention has a first main surface (1a) on which plural the first electrodes (10) for electric connection with the semiconductor chip (2), a second main surface (1b) opposing the first main surface, and an interconnect region interposed between the first main surface and the second main surface. The first electrodes include plural first signal electrodes (10_Rx) and second signal electrodes (10_Tx) arranged orderly for receiving supply of signals at a predetermined frequency. The first signal electrodes and the second signal electrodes are arranged being dispersed in the arrangement thereof. The interconnect region includes a core substrate (21), plural interconnect layers (20, 22) formed respectively on the both surfaces of the core substrate, and plural first through holes (CR1) that pass through the core substrate for forming an impedance matching capacitance. The interconnect region further includes plural first vias (CT1) that pass through the interconnect layer (20) formed to the core substrate on the side of the first main surface and plural first signal interconnects (SNR1) connected to the corresponding first signal electrodes, and plural second interconnects (SNT1) connected to the corresponding second signal electrodes. The first through hole is connected to the first signal interconnect at a position spaced apart from the first signal electrode by a first interconnect length (LR1), and the first via is connected to the second signal interconnect at a position spaced apart from the second signal electrode by a second interconnect length (LT1) substantially equal with the first interconnect length.

The configuration can provide an interconnect substrate capable of providing good signal transmission characteristics while suppressing the manufacturing cost in the same manner as that described in the paragraph (1).

[19] (a Plurality of Matching Circuits to One Signal Interconnect)

In the interconnect substrate described in the item 18, the interconnect region further includes plural second through holes (CT2) that pass through the core substrate for forming an impedance matching capacitances and plural second via (CR2) that pass through the interconnect layer formed to the core substrate on the side of the second main surface (22). The second through hole is connected to the second signal interconnect at a position spaced apart from the second signal electrode by a third interconnection length (LR2) which is longer than the first interconnect length, and the second via is connected to the second signal interconnect at a position spaced apart from the first signal electrode by a fourth interconnect length (LT2) which is substantially equal with the third interconnect length.

In the same manner as described in the item 2, the configuration can improve the signal characteristics in a wider frequency band and can increase the density of the matching circuits and decrease the interconnect density further.

[20] (Semiconductor Device Having a Packaging Substrate in which Through Holes and Vias are Formed being Mixed Together as a Matching Circuit)

A semiconductor device (10) according to a typical embodiment of the invention has a semiconductor chip (2) and an interconnect substrate (1) on which a semiconductor chip is mounted. The interconnect substrate has a first main surface (1a) which is connected electrically to the semiconductor chip and in which plural signal electrodes for receiving supply of signals at a predetermined frequency are formed, a second main surface (1b) opposing the first main surface, and an interconnect region interposed between the first main surface and the second main surface. The interconnect region includes a core substrate (21), plural interconnect layers (20, 22) formed on both surfaces of the core substrate respectively, plural signal interconnects (SNR1 to SNRm, SNT1 to SNTn) formed in the interconnect layer and extended from the signal electrodes, and plural impedance matching circuits connected to the signal interconnect at a position spaced apart from the signal electrodes by a predetermined interconnect length (LR1≈LT1). A portion of the plural impedance matching circuits is formed of plural through holes (CR1) that pass through the core substrate and a remaining portion thereof is formed of plural vias (CT1) that pass through the interconnect layer (20) formed to the core substrate on the side of the first main surface.

According to the configuration, since the through holes and vias as the impedance matching circuit are formed in different layers, it is possible to form more impedance matching circuits on the interconnect substrate compared with a case of forming the impedance matching circuits only by the through holes.

[21] (Correction Circuit in the First Stage is Formed to a Position Near $\lambda/4$)

In the interconnect substrate of the item 19, the first interconnect length corresponds to $\frac{1}{4}$ of the electromagnetic wavelength (λa, λc) in accordance with the first frequency (fa, fc) in the signal band required for the signal transmission line.

The configuration can further decrease the distortion of the signal waveform by the reflection signal reflected at the first signal interconnect end (second signal interconnect end) on the side of the first signal electrode (on the side of the second signal electrode).

[22] (Correction Circuit in the First Stage is Formed to a Position Near λ/4 and Correction Circuit in the Second Stage is Formed to a Position Near 3λ/4)

In the interconnect substrate described in the item 21, the third interconnect length corresponds to ¾ of electromagnetic wavelength (λb, λd) in accordance with second frequency (fb, fd) different from the first frequency in the signal band required for the signal transmission line.

According to the configuration, since the matching circuit (for example, first through hole) in the first stage and the matching circuit (second via) in the second stage are formed at positions different from each other, regions for forming the matching circuits in the second stage can be ensured easily, and the density of the matching circuits can be increased and the interconnect density can be decreased further. This is effective in a case, particularly, where the value of the first frequency is close to the value of the second frequency and it is difficult to dispose both of the matching circuits in the first stage and the second stage at the position of ¼ of the electromagnetic wavelength.

2. Explanation for the Form of Description, Basic Terms, and Usage in the Present Application In the present application, preferred embodiments are described, if necessary, being divided into plural sections for the sake of convenience. However, they are not independent of each other unless otherwise specified, but may be each of portions of an example, one may be details for a portion, a modified example of a portion or the whole of the other. Further, description for an identical portion is not repeated as a rule. Further, each of constituent elements in the embodiment is not essential unless otherwise specified, or excluding a case limited theoretically to a specified number and it is apparently not so from the context.

Further, in the present application, when "semiconductor device" or "semiconductor integrated circuit device" is referred to, this mainly means various kinds of transistors (active devices) per se or those devices in which resisters, capacitors, etc. are integrated together with the transistors as the main component on a semiconductor chip, etc. (for example, single crystal silicon substrate), packaged semiconductor chips, etc. Typical examples of various kinds of the transistors can include, for example, MISFET (Metal Insulator Semiconductor Field Effect Transistors) typically represented by MOSFET (Metal Oxide Semiconductor Field Effect transistors). Typical configuration of the integrated circuits can include, for example, CMIS (Complementary Metal Insulator Semiconductor) type integrated circuits typically represented by CMOS (Complementary Metal Oxide Semiconductor) type integrated circuits comprising N-channel type MISFET and P-channel type MISFET in combination.

Similarly, in the description of embodiments, when it is described as "X comprising A" for material, composition, etc., this does not exclude a case comprising other elements than A as one of main constitutional elements unless otherwise specified, and a case where it is apparently not so from the context. For example, when referring to the ingredient, this means "X comprising A as a main ingredient". For example, when "silicon material" is referred to, this is not restricted only to pure silicon but, needless to say, includes polynary alloys comprising silicon as a main ingredient such as SiGe alloy, as well as materials also containing other additives, etc.

Similarly, while preferred examples are shown for shapes, positions, properties, etc. it is needless to say that they are not restricted strictly thereto unless otherwise specified, and a case where they are apparently not from the context.

Further, when specific numerical value, quantity, or the like is referred to, the value may be greater than or less than the specified number, unless otherwise specified, or in a case where the number is theoretically limited to the specified number and in a case where it is not apparently so from the context.

"Wafer" usually means a single crystal silicon wafer on which a semiconductor integrated circuit device (also semiconductor device and electronic device) is mounted. Needless to say, the wafer also includes epitaxial wafers, and composite wafers comprising insulative substrates such as SOI substrates and LDC glass.

"Solder" is generally a metal material of low melting temperature (about lower than 250° C.) comprising tin as one of main ingredients. Solder includes "lead-containing solder" that contains lead and "lead-free solder" that does not contain lead. In the present invention, the solder bump is formed of the lead-free solder as an example.

3. Details of Embodiment

Embodiments of the present invention will be described further in details. In each of the drawings, identical or similar portions carry identical or similar symbols or reference numerals, and description therefor is not repeated as a rule. Further, in the appended drawings, hatchings may sometimes be omitted even for a cross-sectional view in a case where hatching rather makes the drawing complicate or in a case where the difference from a vacant portion is clear. In connection therewith, even for a hole which is closed in view of a plan view, contours at the background may sometimes be omitted in a case where this is clear in view of the description or the like. Further, hatchings may sometimes be applied even to a portion of a not cross-sectional view in order to clearly show that the portion is not a vacant portion.

FIG. 1 is an entire schematic cross sectional view of an electronic circuit having semiconductor devices according to a first embodiment of the present invention mounted thereon.

An electronic circuit 200 illustrated in FIG. 1 is, for example, a circuit module mounted on network equipment such as communication equipment in a base station of mobile telephones or a router used for high speed communication for providing the network equipment with a communication function. In the electronic circuit 200, plural semiconductor devices and various kinds of electronic parts mounted, for example, on a mounting substrate (printed substrate) 6 such as a mother board electrically are connected by an interconnect pattern formed in the mounting substrate 6 and the parts transmit/receive various signals to between each other thereby providing desired functions. FIG. 1 typically illustrates a semiconductor device 100 and another semiconductor device 101 as plural parts that form the electronic circuit 200.

The semiconductor device 100 and another semiconductor device 101 are electrically connected by way of the mounting substrate 6 and transmit/receive signals between each other. Although not particularly restricted, the semiconductor device 100 has, for example, a storage device (memory) for storing data. Further, another semiconductor device 101 is, for example, a memory controller which accesses to the memory in the semiconductor device.

As illustrated in FIG. 1, the semiconductor device 100 includes two semiconductor chips 2 and 3, plural external terminals 8 formed of solder bumps (solder balls), and a packaging substrate (interconnect substrate, interposer) 1 on which the semiconductor chips 2 and 3 are mounted. The semiconductor device 100 is, for example, a SIP sealed by a FCBGA (Flip Chip Ball Grid Array) type package in which solder bump to form bump electrodes 7 and 13 are applied to the semiconductor chips 2 and 3, and face down-bonded to the packaging substrate 1. The number of bump electrodes of the semiconductor device 100 illustrated in the drawing is less than the actual number for the sake of simplifying the drawing. An actual bump pitch is, for example, about 100 μm for solder bumps on the side of the semiconductor chip (bump electrodes 7, 13) and about 1 mm for the solder bumps (external terminals 8) on the side of the mounting substrate 6. The material for the solder bump preferably includes, for example, a silver-added tin type lead-free solder with addition of 1.5% by weight of silver (melting point; about 221° C.). Various kinds of lead-free solders can be applied in addition to the example described above. Further, while lead type solder may also be used if the situation allows, use of the lead-free solder is preferred in view of the environment.

Figure 2:
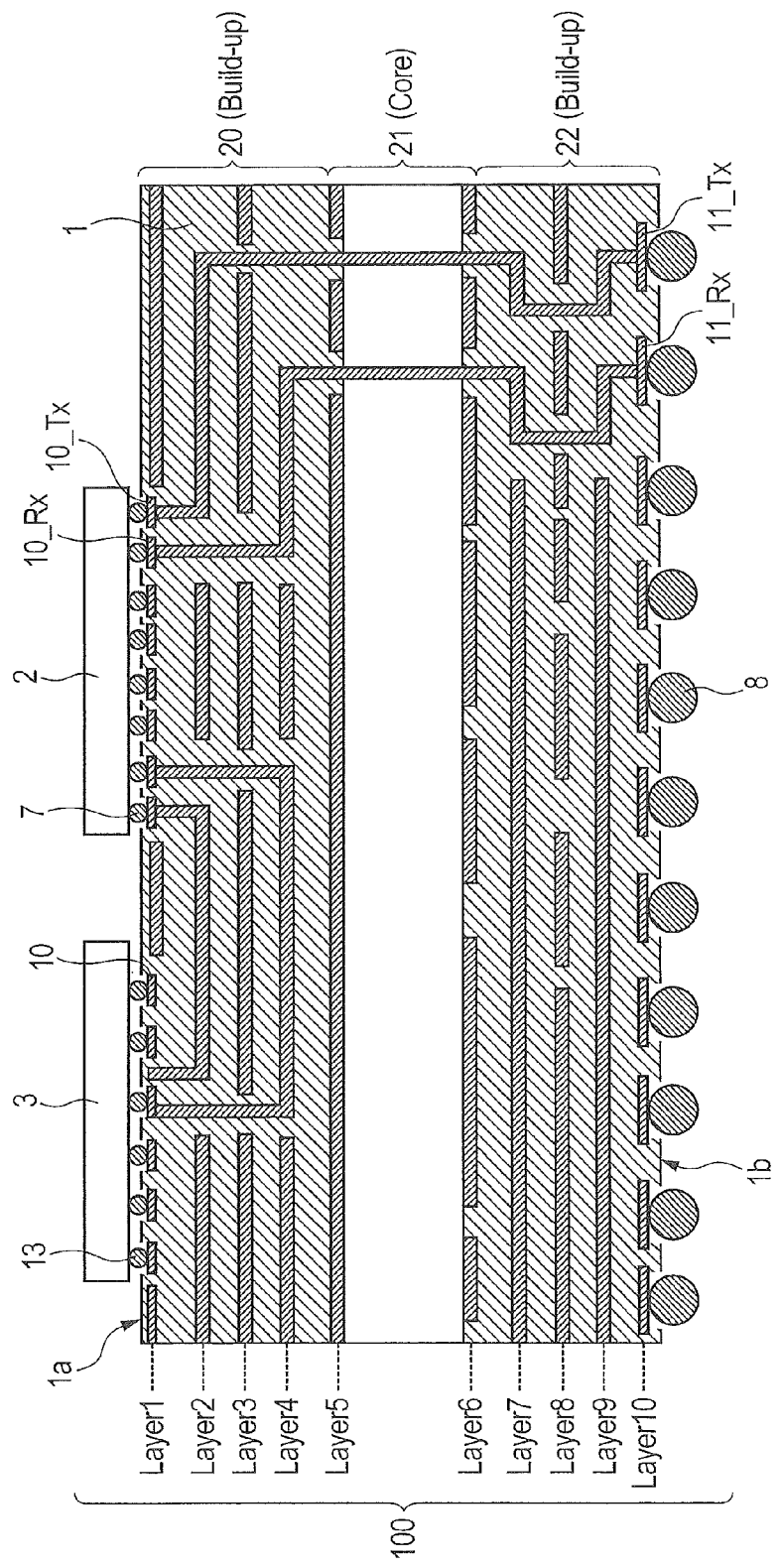
FIG. 2 is a detailed entire schematic cross sectional view of the semiconductor device.

FIG. 2 illustrates a detailed entire schematic cross sectional view of the semiconductor device 100.

As illustrated in FIG. 2, the packaging substrate 1 has a first main surface 1a formed with plural first electrodes 10 for electric connection with the semiconductor chips 2 and 3 by way of the bump electrodes 7 and 13, a second main surface 1b opposing the first main surface 1a and formed with plural second electrodes 11 for electric connection with the external terminals 8, and an interconnect region interposed between the first main surface 1a and the second main surface 1b. The packaging substrate 1 is, for example, a buildup substrate. The interconnect region includes, a core substrate 21 and plural interconnect layers (hereinafter also referred to as buildup layers) formed on the both surfaces of the core substrate 21 respectively. The core substrate 21 is a glass epoxy substrate having, for example, two interconnect layers, i.e., Layer 5 and Layer 6. In the buildup layers 20 and 22, an insulation layer (resin) and an interconnect layer (conductor) are stacked alternately. For example, the buildup layer 20 formed to the core substrate 21 on the side of the first main surface 1a has four interconnect layers comprising Layer 1, Layer 2, Layer 3, and Layer 4 and the buildup layer 22 formed to the core substrate 21 on the side of the second main surface 1b has four interconnect layers comprising Layer 7, Layer 8, Layer 9, and Layer 10. As the metal material for the interconnect pattern formed in the interconnect layers, i.e., Layers 1 to 10, copper (Cu), aluminum (Al), etc. can be used.

The semiconductor chip 3 is, for example, a memory IC. The semiconductor chip 2 is, for example, a logic IC that accesses to the semiconductor chip 3 in accordance with an access demanded from the outside. The semiconductor chip 2 writes and reads data to and from the semiconductor chip 3 in accordance with an access from another semiconductor device 101. The semiconductor chip 2 includes, for example, a SerDes circuit that converts serial data and parallel data to each other and performs serial communication, for example, at 12.5 GHz relative to the semiconductor device 101 and performs parallel communication, for example, at 1.2 GHz relative to the semiconductor chip 3 by way of the SerDes circuit.

Figure 3:
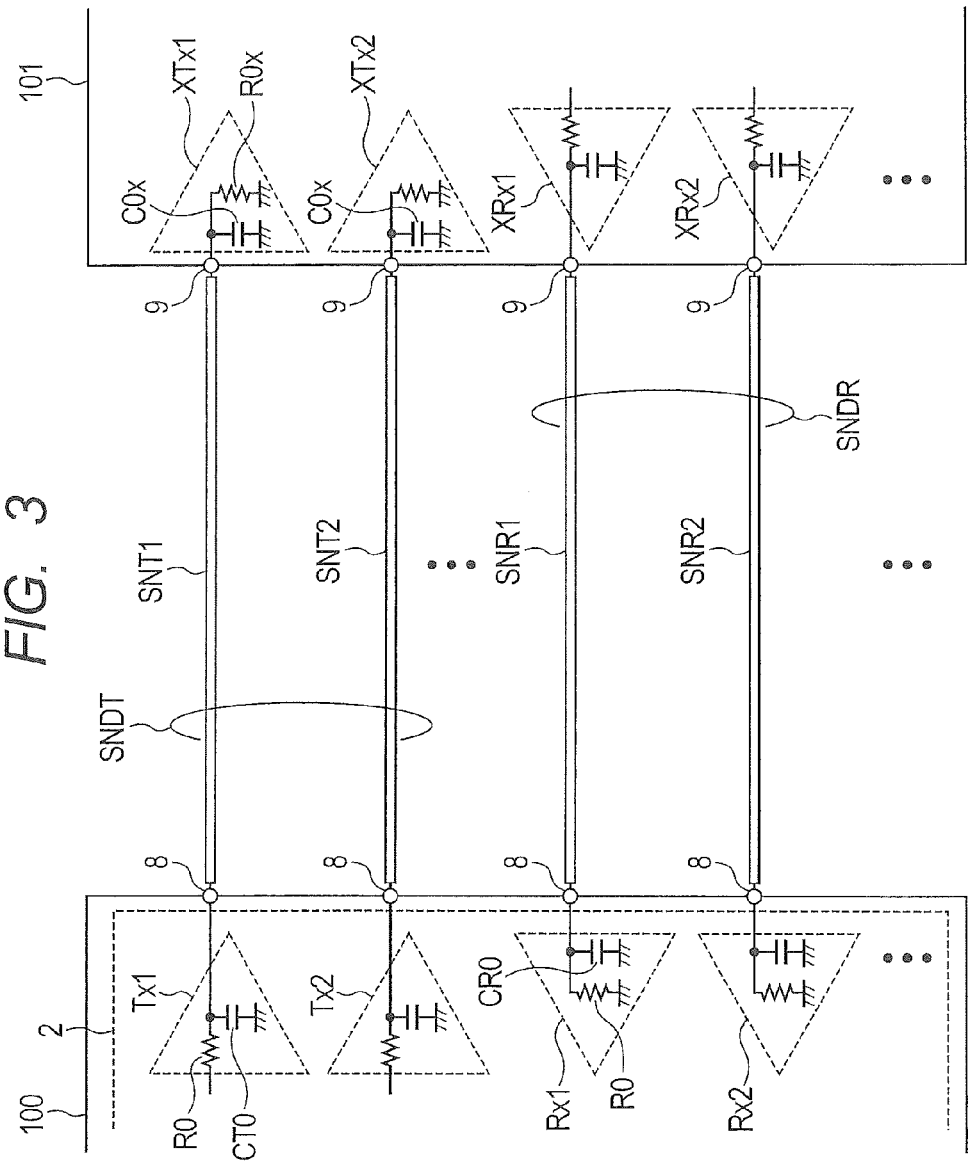
FIG. 3 is a view illustrating a connection relation between the semiconductor device and another semiconductor device.

FIG. 3 is a view illustrating a connection relation between the semiconductor device 100 and another semiconductor device 101.

As illustrated in FIG. 3, the semiconductor chip 2 has plural I/O devices (interface buffers) as input/output circuits for transmitting/receiving signals (data) relative to another semiconductor device 101. Specifically, the semiconductor chip 2 has receiving I/O devices Rx1 to Rxm (m is an integer of 2 or greater) and a transmitting I/O devices Tx1 to Txn (n is an integer of 2 or greater). In the same manner, another semiconductor device 101 has plural transmitting I/O devices XTx1 to XTxm and receiving I/O devices XRx1 to XRxn.

The transmitting I/O devices Tx1 to Txn of the semiconductor device 100 are connected respectively to the corresponding I/O devices XRx1 to XRxn of another semiconductor device 101 by way of the external terminals 8 of the semiconductor device 100, signal lines SNT1 to SNTn, and the external terminals 9 of another semiconductor device 101. In the same manner, the receiving I/O devices Rx1 to Rxm of the semiconductor device 100 are connected to the corresponding I/O devices XTx1 to XTxm of another semiconductor device 101 respectively by way of the external terminals 8 of the semiconductor device 100, the signal lines SNR1 to SNRm and the external terminals 9 of another semiconductor device 101.

The high speed serial communication between the semiconductor device 100 and another semiconductor device 101 is performed, for example, by LVDS (Low Voltage Differential Signaling) in which the signal lines SNT1 to SNTn and SNR1 to SNRm form plural differential signal line pairs. For example, signal lines SNT1 and SNT2 form a differential signal line SNDT for high speed serial communication, and the signal lines SNR1 and SNR2 form a differential signal line SNDR. In this embodiment, reference numerals SNR1 to SNRm, SNTR1 to SNTRn, SRDT, and SNDR represent not only the signal lines but also transmission lines from the input/output terminals of the I/O devices of the semiconductor device 100 to the input/output terminals of the I/O devices of another semiconductor device 101.

For example, when data are transmitted from the semiconductor chip 2 to another semiconductor device 101, signals transmitted from the transmitting I/O devices Tx1 to Txn of the semiconductor chip 2 are supplied by way of the signal lines SNT1 to SNTn to the I/O devices XRx1 to XRxn of another semiconductor device 101. In the same manner, when the semiconductor chip 2 receives data from another semiconductor device 101, signals transmitted from the I/O devices XTx1 to XTxm of another semiconductor device 101 are supplied by way of the signal lines SNR1 to SNRm to the receiving I/O devices Rx1 to Rxm of the semiconductor chip 2.

The signal lines SNT1 to SNTn and SNR1 to SNRm are adjusted such that each of them has 50Ω characteristic impedance and, in accordance therewith, the transmitting I/O devices Tx1 to Txn and the receiving I/O devices Rx1 to Rxm of the semiconductor chip 2 are terminated each by a resistance R0 (=50Ω). However, a parasitic capacitance CT0 is present at the output end of each of the transmitting I/O devices Tx1 to Txn and a parasitic capacitance CR0 is present at the input end of the receiving I/O devices Rx1 to Rxm. Accordingly, as described above, since the admittance of each of the parasitic capacitance CT0 and CR0 increases more as the frequency of the signal supplied to the signal lines SNT1 to SNTn and SNR1 to SNRm is higher, impedance mismatching increases between the I/O devices Tx1 to Txn (Rx1 to Rxm) and the signal lines SNT1 to SNTn (SNR1 to SNRm), tending to cause signal reflection. Then, in the semiconductor device 100 according to this embodiment, matching circuits for impedance matching are formed in the packaging substrate 1.

Figure 4:
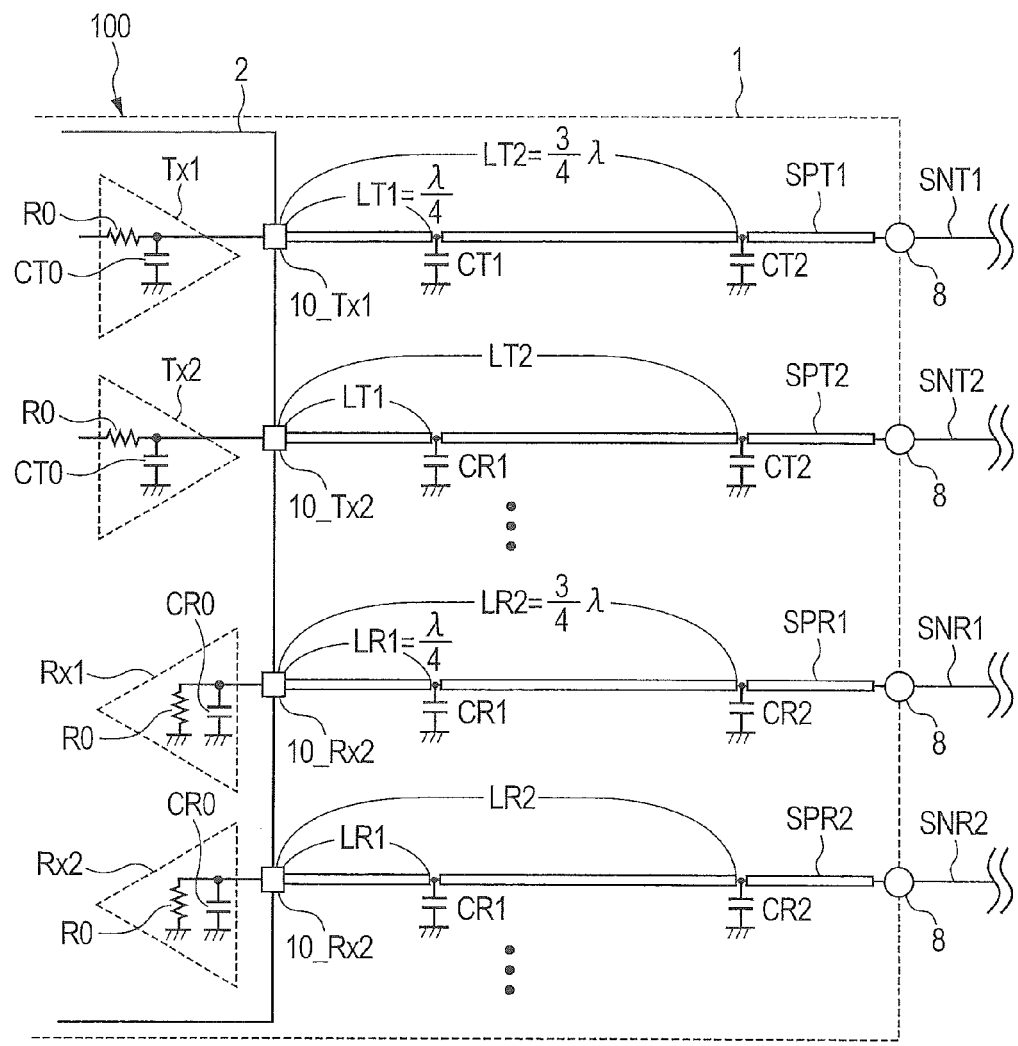
FIG. 4 is a view illustrating matching circuits formed in a packaging substrate of the semiconductor device.

FIG. 4 is a view illustrating matching circuits formed in the packaging substrate 6 of the semiconductor device 100.

In the packaging substrate 6, capacitances are disposed as matching circuits for impedance matching to the signal lines SPT1 to SPTn that connect the bump electrodes 7 connected respectively to the output ends of the transmitting I/O devices Tx1 to Txn formed in the semiconductor chip 2 and the corresponding external terminals 8.

Specifically, in the packaging substrate 6, capacitances CT1 are formed respectively at positions spaced apart from the output ends of the transmitting I/O devices Tx1 to Txn on the signal lines SPT1 to SPTn to which the output ends of the transmitting I/O devices Tx1 to Txn are connected (for example, first signal electrodes 10 connected to the output ends of the transmitting I/O devices Tx1 to Txn) by a interconnect length LT1. The interconnect length LT1 is a length corresponding to ¼ of an electromagnetic wavelength λa in accordance with a first frequency fa in a signal band required for the transmission lines SNT1 to SNTn. For example, at fa=30 GHz, λa/4 is about 1 mm. According to this configuration, a reciprocal distance of the signal at a frequency of fa when it is outputted from the output end of the I/O device Tx1, reflected at the capacitance CT1, and returned again to the output end of the I/O device Tx1 is λa/2 (=2×λa/4), for example, in the transmission line SNT1. Accordingly, since the signal outputted from the output end of the I/O device Tx1 returns to the output end of the I/O device Tx1 in a state being displaced by π (180 degree) in view of the phase, the reflection wave reflected by the parasitic capacitance CT0 at the output end of the I/O device Tx1 and the reflection wave reflected by the capacitance CR1 are offset to each other and the distortion of the signal waveform in the transmission line SNT1 can be decreased. The length corresponding to ¼ of the electromagnetic wavelength λa is not only restricted just to the exact interconnect length λa/4 but also more or less error is permitted relative to the exact interconnect length λa/4. For example, a length within range of an error of ±20% relative to λa/4 is permitted. Actually, since the I/O device is not a simple capacitance or resistance but has a structure of compositing them, an optimal characteristic cannot sometimes be obtained even when the length is set just to the exact interconnect length "λ/4". In such a case, an optimal arrangement of the capacitance CT1 may be found while considering the result of simulation and an actually measured value. As a result, the optimal arrangement of the capacitance CT1 is sometimes within the range, for example, from λ/8 to λ/4.

Further, capacitances CT2 as matching circuits are formed each at a position spaced apart from the output ends of the transmitting I/O devices Tx1 to Txn by an interconnect length LT2. The interconnect length LT2 is a length corresponding to ¾ of an electromagnetic wavelength λb in accordance with a predetermined frequency fb in a signal band required for the transmission line SNT1. According to the configuration, the reciprocal distance, for example, in the transmission line SNT1, in which a signal at the frequency fb outputted from the output end of the I/O device Tx1 is reflected by the capacitance CT2 and returned again to the output end of the I/O device TX1 is 3λb/2 (=2×3λb/4). Accordingly, the reflection wave of the signal outputted from the output end of the I/O device Tx1 returns to the output end of the I/O device Tx1 in a state displaced by π in view of the phase in the same manner as the case that the capacitance CT1 is disposed at a position spaced apart from the output end of the I/O device Tx1 by ¼ of the electromagnetic wavelength. Thus, the reflection wave reflected by the parasitic capacitance CT0 at the output end of the I/O device Tx1 and the reflection wave reflected by the capacitance CT2 offset to each other and distortion of the signal waveform in the transmission line SNT1 can be decreased further. The length corresponding to ¾ of the electromagnetic wavelength λb is not only restricted just to the exact interconnect length 3λb/4 but a more or less error is permitted relative to the exact interconnect length 3λb/4 in the same manner as the interconnect length λa/4 described above. For example, a length within the range of an error of ±20% relative to λb/4 is permitted.

In the packaging substrate 6, capacitances as the impedance matching circuits are disposed, in the same manner and as the transmission side, to the signal line SPR1 to SPRn which connect the bump electrodes 7 connected respectively to the output ends of the receiving I/O devices Rx1 to Rxm formed in the semiconductor chip 2 and the corresponding external terminals 8.

Specifically, capacitances CR1 are formed spaced apart each by an interconnect length LR1 from the input ends of the I/O devices Rx1 to Rxm (for example, first signal electrodes 10 connected to the input ends of the I/O devices Rx1 to Rxm) of the I/O devices Rx1 to Rxm on the signal lines SPR1 to SPRm connected with the input ends of the receiving I/O devices Rx1 to Rxm. The interconnect length LR1 is a length corresponding to ¼ of an electromagnetic wavelength λc in accordance with a predetermined frequency fc in a signal band required for the transmission line SNR1. Thus, distortion of the signal waveform in the transmission line SNR1 can be decreased in the same manner as that in the transmission line SNT1. Further, capacitances CR2 are formed each at a position spaced apart by an interconnect length LR2 from the input ends of the receiving I/O devices Rx1 to Rxn. The interconnect length LR2 is a length corresponding to ¾ of an electromagnetic wavelength λd in accordance with a predetermined frequency fd in the signal band required for the transmission line SNR1. According to the configuration, distortion of the signal waveform in the transmission line SNR1 can be decreased further in the same manner as in the transmission line SNT1.

In this embodiment, it is assumed that an identical frequency band (12.5 Gbps) is required both on the transmission side and the receiving side of the semiconductor device 100 and that fa=fc (λa=λc) and fb=fd (λb=λd) also for the frequency. Thus, the interconnect length LR1 and the interconnect length LT1 are substantially made equal, and the interconnect length LR2 and the interconnect length LT2 are made substantially equal. The substantially equal length means not only the just identical length but also includes a case where a predetermined error (for example, about ±20%) is present. Further, in the following description, reference sign CT1 represents not only the capacitance but also a matching circuit formed of the capacitance. This is applied also to the reference signs CT2, CR1, and CR2.

Figure 5A:
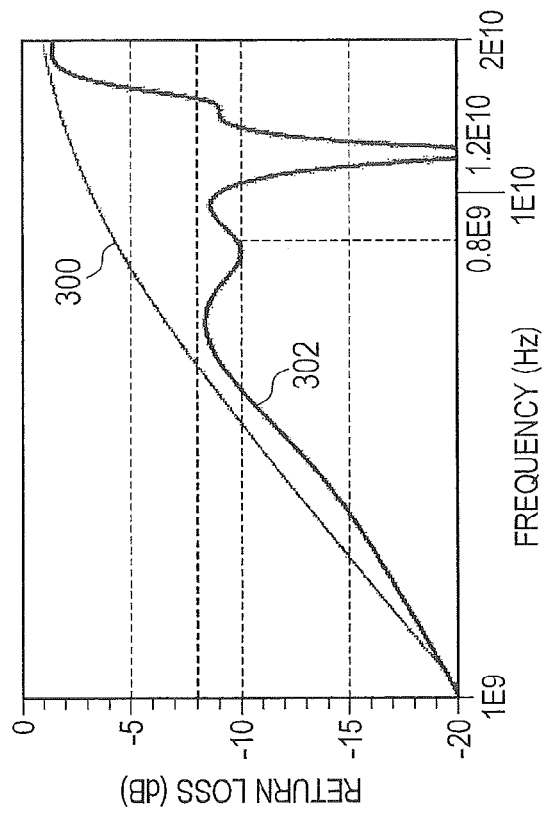
FIG. 5A is a graph showing signal characteristics when a matching circuit CT1 is disposed to a transmission line SNT1.
Figure 5B:
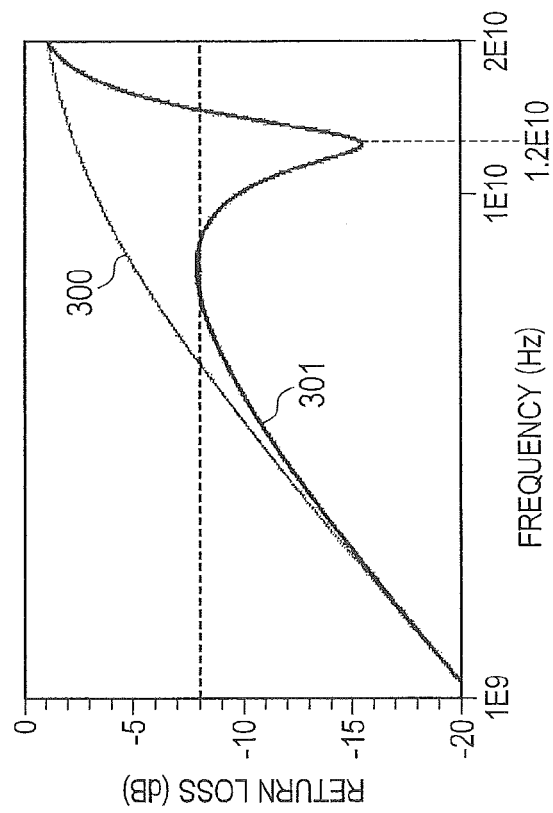
FIG. 5B is a graph showing signal characteristics when matching circuits CT1 and CT2 are disposed to a transmission line SNP1.

FIG. 5A illustrates signal characteristics in a case of disposing a matching circuit CT1 on the signal line SPT1 and FIG. 5(B) illustrates signal characteristics in a case of disposing matching circuits CT1 and CT2 in the signal line SPT1. It is assumed here as: CT1=0.25 pF and C2=0.05 pF.

In FIGS. 5A and 5B, reference numeral 300 shows a return loss of a transmission line SNT1 when none of the matching circuits CT1 and CT2 is disposed. A reference numeral 301 shows a return loss when a matching circuit CT1 is disposed at a position spaced apart from the output end of the I/O device Tx1 by an interconnect length LT1 corresponding to ¼ of the electromagnetic wavelength in accordance with a signal frequency f1 (=12 GHz). Reference numeral 302 shows a return loss when a matching circuit CT1 is disposed at a position spaced apart from the output end of the I/O device Tx1 by an interconnect length LT1 corresponding to ¼ of the electromagnetic wavelength in accordance with a signal frequency f1 (=12 GHz) and disposing a matching circuit CT2 at a position spaced apart by an interconnect length LT2 corresponding to ¾ of an electromagnetic wavelength in accordance with a signal frequency f2 (=8 GHz).

As shown by the reference numeral 300, when none of the matching circuits CT1 and CT2 is disposed, the return loss increases as the frequency is higher. On the other hand, as shown by the reference numeral 301 when the matching circuit CT1 is disposed at a position spaced apart from the output end of the I/O device Tx1 by an interconnect length LT1, a bottom of characteristics appears at a position near 12 GHz. Further, as shown by reference numeral 302 when the matching circuit CT2 is disposed at a position spaced apart by the interconnect length LT2 from the output end of the I/O Tx1 in addition to the capacitance CT1, a bottom of characteristics as the return loss appears at a position near 8 GHz in addition to a position near 12 GHz. By forming plural bottoms of characteristics, return loss can be suppressed in a wide range of the band. Since CT1>CT2, while the magnitude of the bottom of characteristic near 8 GHz is smaller than that near 12 GHz, the return loss can be decreased more by further increasing the matching circuit CT2. Although not illustrated, when capacitances CR1 and CR2 are disposed in the receiving signal line SPR1 of the semiconductor chip 2, signal characteristics show a similar trend as that in FIGS. 5A and 5B.

A specific configuration of matching circuits CT1 and CT2 (CR1 and CR2) is to be described.

In the semiconductor device 100 according to this embodiment, the capacitances CT1 and CT2 (CR1 and CR2) as the matching circuit are obtained by the parasitic capacitances of through holes or vias in the packaging substrate 1. The through hole is a through hole that passes through the core substrate 21 and the via is a through hole that passes through an insulation layer for electrically connecting adjacent interconnect layers between them in the buildup layers 20 and 22.

FIG. 6 is a schematic view illustrating matching circuits CT1 and CT2 (CR1 and CR2) formed in the package substrate 1. As shown in the drawing, through holes (TH) or vias (Via) are formed each at a position spaced by a predetermined interconnect length (LT1, LT2, LR1, and LR2) from the input end (output end) of the I/O devices of the semiconductor chip 2. The capacitances CT1, CT2, CR1, CR2 are obtained by utilizing the parasitic capacitance of the through holes or vias.

As the capacitances CT1, CT2, CR1 and CR2, parasitic capacitances formed mainly between the land connected to the through hole or the via and a ground plane formed at the periphery thereof (identical interconnect layer and upper and lower interconnect layers) is utilized. Accordingly, the capacitance value of each of the matching circuits (capacitance) CT1, CT2, CR1, and CR2 is obtained mainly by adjusting the magnitude of the land diameter. For example, the diameter of the land of the via that forms the capacitance as the matching circuit is made larger than that of the land of a usual via (via for electrically connecting adjacent interconnect layers respectively). For example, when the diameter of a usual via is a 90 to 100 μm, the diameter of the via as the matching circuit has a larger size. The diameter of the land of the through hole that forms the capacitance as the matching circuit is made identical with or optionally larger than that of the land of the usual through hole (through hole that passes through the core substrate for electrically connecting the interconnects formed in upper and lower interconnect layers respectively).

FIG. 7 and FIG. 8 illustrate examples of shapes of lands connected to the through hole or the via for forming the matching circuit.

Figure 7A:
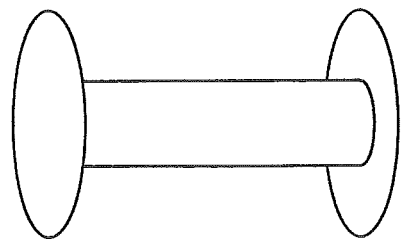
FIG. 7A shows an example of a first shape of a land connected to a through hole for forming a matching circuit.

FIG. 7A shows a first example of shape of a land connected to a through hole that forms the matching circuit, FIG. 7B shows a second example of shape of the land connected to the through hole that forms the matching circuit and FIG. 7C shows a third example of shape of the land connected to the through hole that forms the matching circuit.

In the first example of shape illustrated in FIG. 7A, diameters of two upper and lower lands connected to the through hole are made identical in a cross sectional view of the packaging substrate 1.

In the second example of shape illustrated in FIG. 7B, diameters of the upper and lower lands connected to the through hole are made different in a cross sectional view of the packaging substrate 1. Thus, coupling between the through hole and the interconnect in the upper and lower layers adjacent therewith can be decreased by increasing the diameter of the land adjacent to a layer on the side where the interconnect density is lower and by decreasing the diameter of the land adjacent to a layer on the side where the interconnect density is higher. For example, when the interconnect density is higher on the side of the upper layer than that on the side of the lower layer of the through hole, as shown in FIG. 7B, the diameter of the land for the upper layer is preferably formed larger than the diameter of the land for the lower layer.

In the third example of shape illustrated in FIG. 7C, plural lands are connected in a vertical directions of the through hole in a cross sectional view of the packaging substrate 1. This example of shape is applicable to a case where the interconnect layer is formed also in the inside in addition to both surfaces of the core substrate 21. FIG. 7C illustrates a case where two lands are formed in the through hole between the uppermost land the lowermost land. According to this configuration, the magnitude of the parasitic capacitance formed between the land and the ground plane at the periphery thereof can be controlled depending on the number of the lands. Accordingly, the diameter of the land per one land for obtaining a desired capacitance value can be decreased by increasing the number of stages of the lands, and the area of the region for forming the through hole as the matching circuit can be made smaller. As shown in FIG. 7B, the diameters of the two uppermost and lowermost lands may be different.

Figure 8A:
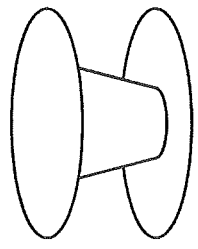
FIG. 8A shows an example of a first shape of a land of a via for forming a matching circuit.
Figure 8B:
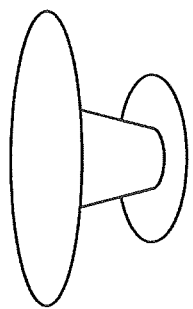
FIG. 8B shows an example of a second shape of the land of the via for forming the matching circuit.
Figure 8C:
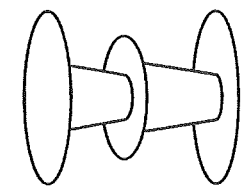
FIG. 8C shows an example of a third shape of the land of the via for forming the matching circuit.
Figure 8D:
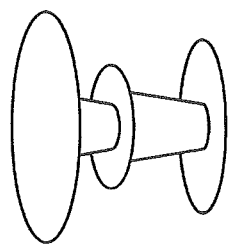
FIG. 8D shows an example of a fourth shape of the land of the via for forming the matching circuit.

FIG. 8A shows a first example of shape of the land of a via to form a matching circuit, FIG. 8B shows a second example of shape of the land connected to a via that forms a matching circuit, FIG. 8C shows a third example of shape of the land connected to the via that forms a matching circuit, and FIG. 8D shows a fourth example of shape of the land connected to the via that forms a matching circuit.

In the first example of shape illustrated in FIG. 8A, diameters of two upper and lower lands connected to the via are made identical in a cross sectional view of the packaging substrate 1.

In the second example of shape illustrated in FIG. 8B, diameters of two upper and lower lands connected to the via are made different in a cross sectional view of the packaging substrate 1. According to the configuration, coupling between the through hole and interconnects in the upper and lower layers adjacent therewith can be decreased as in the case of the through hole described above. For example, when the interconnect density on the side of the lower layer of the via is higher than that on the side of the upper layer of the via, the diameter of the upper layer land may be formed larger than that of the land of the lower layer as shown in FIG. 8B.

In the third example of shape illustrated in FIG. 8C, plural lands are connected in the vertical direction of the via in a cross sectional view of the packaging substrate 1. FIG. 8C illustrates a case in which one land is formed between the uppermost and lowermost lands. According to the configuration, the magnitude of the parasitic capacitance formed between the land and the ground plane at the periphery thereof can be controlled by the number of the lands in the same manner as in the through hole described above. Accordingly, the area of the region for forming the via as the matching circuit can be decreased further by increasing the number of the lands.

In the fourth example of shape illustrated in FIG. 8D, plural lands are connected in the vertical direction of the via and the diameters of the two uppermost and lowermost lands are made different in a cross sectional view of the packaging substrate 1. According to the configuration, the area of the region for forming the via as the matching circuit can be decreased further while decreasing coupling between the through hole and the interconnects in the upper and lower layers adjacent therewith.

FIG. 9 illustrates a plan view of the semiconductor device 100. In the semiconductor device 100 as illustrated in FIG. 9, a semiconductor chip 2 and another semiconductor chip 3 are juxtaposed over the packaging substrate 1. A group of interconnects for connecting the semiconductor chip 2 and another semiconductor chip 3 are formed mainly in the interconnect region of the region B of the packaging substrate 1. A group of interconnects connected to the external terminal 8 for connecting the semiconductor chip 2 and the semiconductor device 101 are formed mainly in the interconnect region of the region A including a range Y from the substrate end P of the packaging substrate 1 to the chip end of the semiconductor chip 2. In the semiconductor device 100, through holes and vias as matching circuits CT1, CT2, CR1, and CR2 are formed, for example, in the region A over the packaging substrate 1.

FIG. 10 illustrates a schematic cross sectional view of the packaging substrate 1 in which through holes and vias are formed as matching circuits. FIG. 10 typically illustrates a signal line SPT1 that forms a differential signal line SNDT and matching circuits CT1 and CT2 connected to them, and a signal line SPR1 that forms a differential signal line SNDR and matching circuits CR1 and CR2 connected to them. For the sake of simplifying the description, the other signal line that forms the differential signal line and matching circuits connected therewith, a via connected to a ground potential, a through hole connected to the ground potential, etc. are not illustrated.

As illustrated in FIG. 10, a matching circuit CR1 in the first stage of the signal line SPR1 on the receiving side of the semiconductor chip 2 is formed of a through hole between the interconnect layers, i.e., between Layers 5 and 6, and a matching circuit CR2 in the second stage is formed of a via between interconnect layers, i.e., between Layers 7 and 9. Further, the matching circuit CT1 in the first stage of the signal line SPT1 on the transmission side of the semiconductor chip 2 is formed of a via between the interconnect layers i.e., between Layers 2 and 4, and the matching circuit CT2 in the second stage is formed of a through hole between interconnect layers, i.e., between Layers 5 and 6. In the signal line SPR1, an interconnect length from the output end (first signal electrode 10_Rx1) of the semiconductor chip 2 to the through hole (CR1) in the first stage is LR1, and an interconnect length from the output electrode (pad) of the I/O device connected to the output end (bump electrode 7) of the semiconductor chip 2 to the via (CR2) in the second stage is LR2. In the signal line SNR2, an interconnect length from the output end (second signal electrode 10_Tx1) of the semiconductor chip 2 to the via (CT1) in the first stage is LT1, and an interconnect length from the output end of the semiconductor chip 2 to the through hole (CT2) in the second stage is LT2. The interconnect length LR1≈LT1 and the interconnect length LR2≈LT2.

As illustrated in FIG. 10, a matching circuit formed of the through hole (CR1) and that formed of the via (CT1) are disposed being mixed together as matching circuits in the first stage. According to the configuration, since the matching circuits in the first stage can be formed so as to be stacked in the vertical direction in a cross section of the packaging substrate 1, the number of the matching circuits formed on one identical plane can be decreased to form the matching circuit at a higher density than usual compared with a case of forming all of the matching circuits in the first stage by the through holes. Particularly, when the interconnect length LR1 and the interconnect length LT1 are substantially equal as in this embodiment, since the matching circuits CR1 and CT1 in the first stage are formed densely at identical positions in the region A over the packaging substrate 1, more matching circuits can be formed at a higher density in the region A when the matching circuit of the through hole and the matching circuit of the via are disposed being mixed together as described above. Further, since the matching circuits are formed in the different layers of the interconnect region of the packaging substrate 1, interconnects connected to the respective matching circuits can be routed easily to decrease the interconnect density. For example, the signal interconnect after passing the matching circuit CT1 formed of the via can be routed in the buildup layer 20 on the upper side of the core substrate 21, and the signal interconnect after passing the matching circuit CT2 formed of the through hole can be routed in the buildup layer 22 on the lower side of the core substrate 21. That is, since the signal interconnects SPT1 to SPTn and SPR1 to SPRm over the packaging substrate 1 that form the differential signal lines SNDR and SNDT can be routed divisionally between the upper and the lower interconnect layers of the core substrate 21, the density of interconnects formed in one interconnect layer can be lowered, this can suppress interference between interconnects to each other.

In the same manner, the matching circuit formed of the through hole (CT2) and that formed of the via (CR2) are disposed being mixed together as the matching circuits in the second stage. With the configuration described above, the matching circuits in the second stage can be formed at a high density in the same manner as the matching circuits in the first stage, and the interconnect density can be lowered. Particularly, in a case where the interconnect length LR2 and the interconnect length LT2 are substantially equal as in this embodiment, when the matching circuit of the through hole and the matching circuit of the via are mixed together, more matching circuits can be formed at a higher density in the region A on the packaging substrate 1 in the same manner as the matching circuits in the first stage.

FIGS. 11A to 11C illustrate connection examples of interconnects to vias as matching circuits. FIG. 11A illustrates a first connection example of an interconnect to a via that forms a matching circuit, FIG. 11B illustrates a second connection example of the interconnect to the via that forms the matching circuit, and FIG. 11C illustrates a third connection example of the interconnect to the via that forms the matching circuit.

In the first connection example illustrated in FIG. 11A, interconnects are connected to a via by way of plural lands in a cross sectional view of the packaging substrate. FIG. 11A illustrates a case in which an interconnect is connected to the uppermost land to be connected to the via and another interconnect is connected to the lowermost land to be connected to the via in the same manner as in the usual connection method of the via and the interconnect.

In the second connection example illustrated in FIG. 11B and the third connection example illustrated in FIG. 11C, interconnects are connected to the via by way of a single land in a cross sectional view of the packaging substrate 1. FIG. 11B illustrates a case in which two interconnects are connected to the lowermost land connected to the via, and FIG. 11C illustrates a case in which two interconnects are connected to an intermediate land among the lands of three stages connected to the via.

In any of the connection methods in FIGS. 11A to 11C, the via can function as the matching circuit. Further, the connection methods of FIGS. 11A to 11C can be combined. For example, among the vias that forms plural matching circuits CT1, a portion of the vias is connected to the interconnects by way of one land as shown in FIGS. 11B and 11C and the a remaining portion of the vias is connected to the interconnects by way of plural lands as shown in FIG. 11A. According to this configuration, interconnects connected to the via that forms the matching circuit CT1 can be routed easily to further increase the density of the matching circuits and decrease the interconnect density.

Further, as illustrated in FIG. 10, a via that forms the matching circuit CT1 and a through hole that forms the matching circuit CR1 are preferably disposed so as not to overlap in a plan view. In the same manner, the through hole that forms the matching circuit CT2 and the via that forms the matching circuit CR2 are preferably disposed so as not to overlap in a plan view. This can suppress interference of signals between the through hole and the via by way of the land.

FIG. 12 to FIG. 18 illustrate plan views of respective interconnect layers corresponding to FIG. 10.

Figure 12:
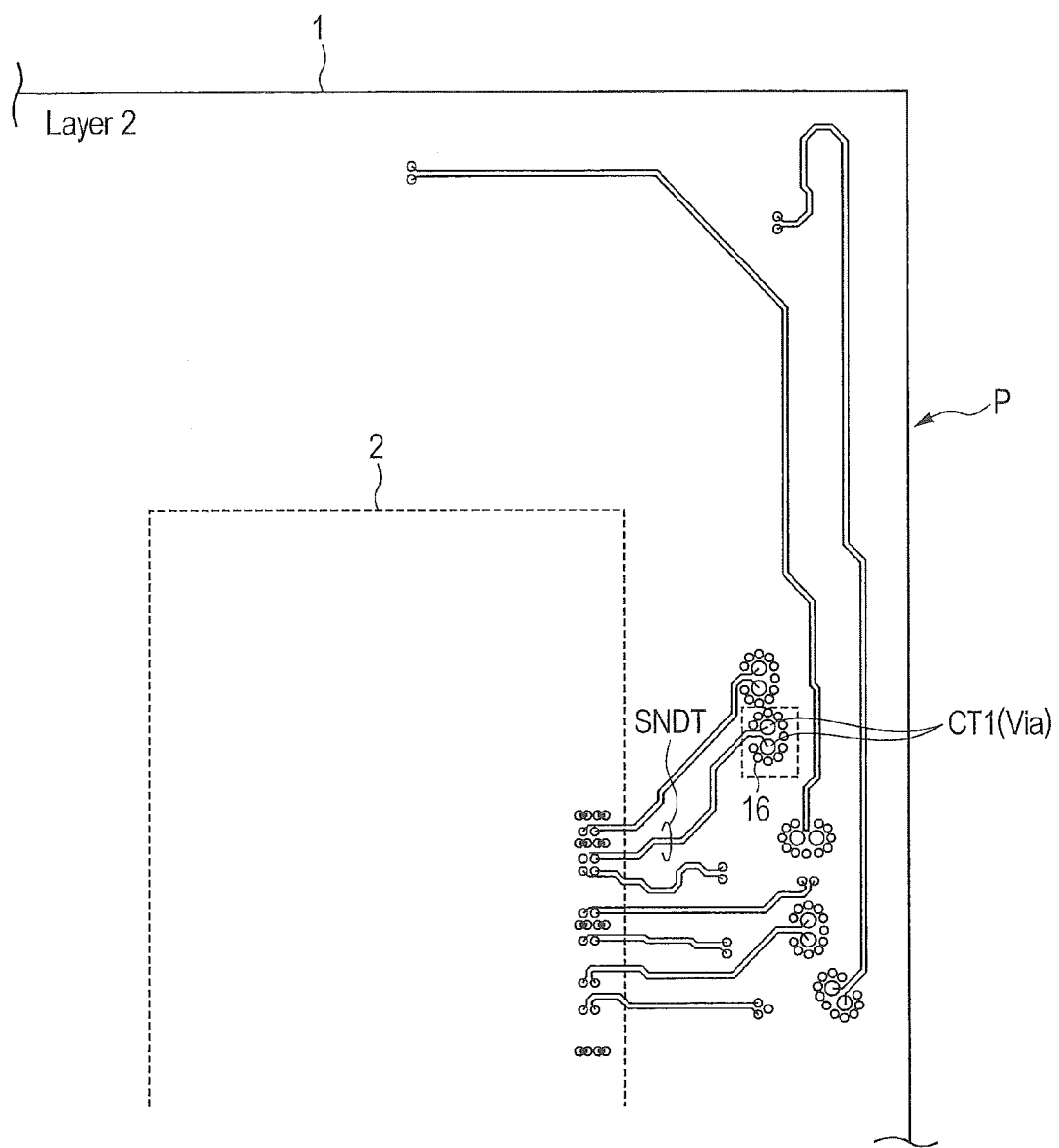
FIG. 12 is a plan view illustrating an interconnect layer: Layer 2.
Figure 13:
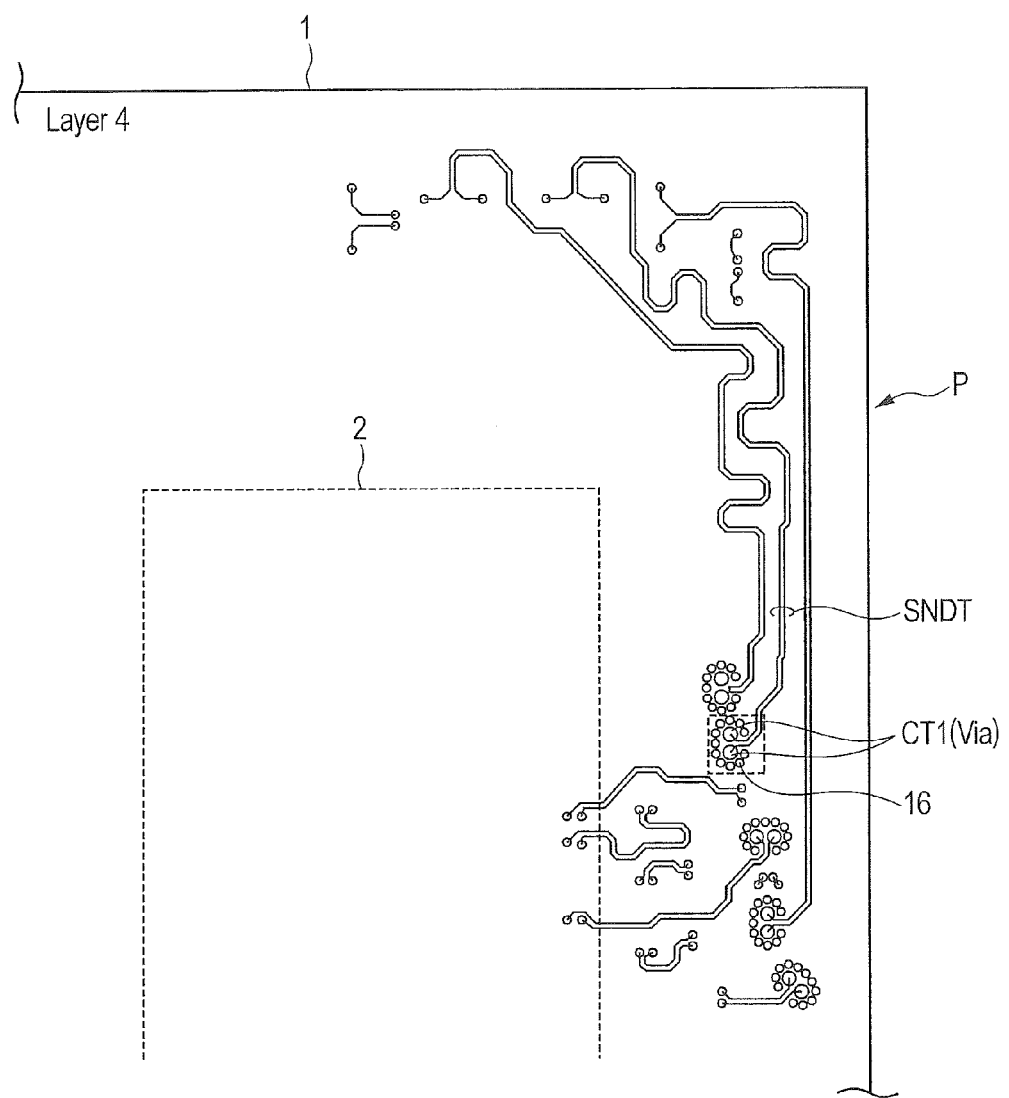
FIG. 13 is a plan view illustrating an interconnect layer: Layer 4.
Figure 14:
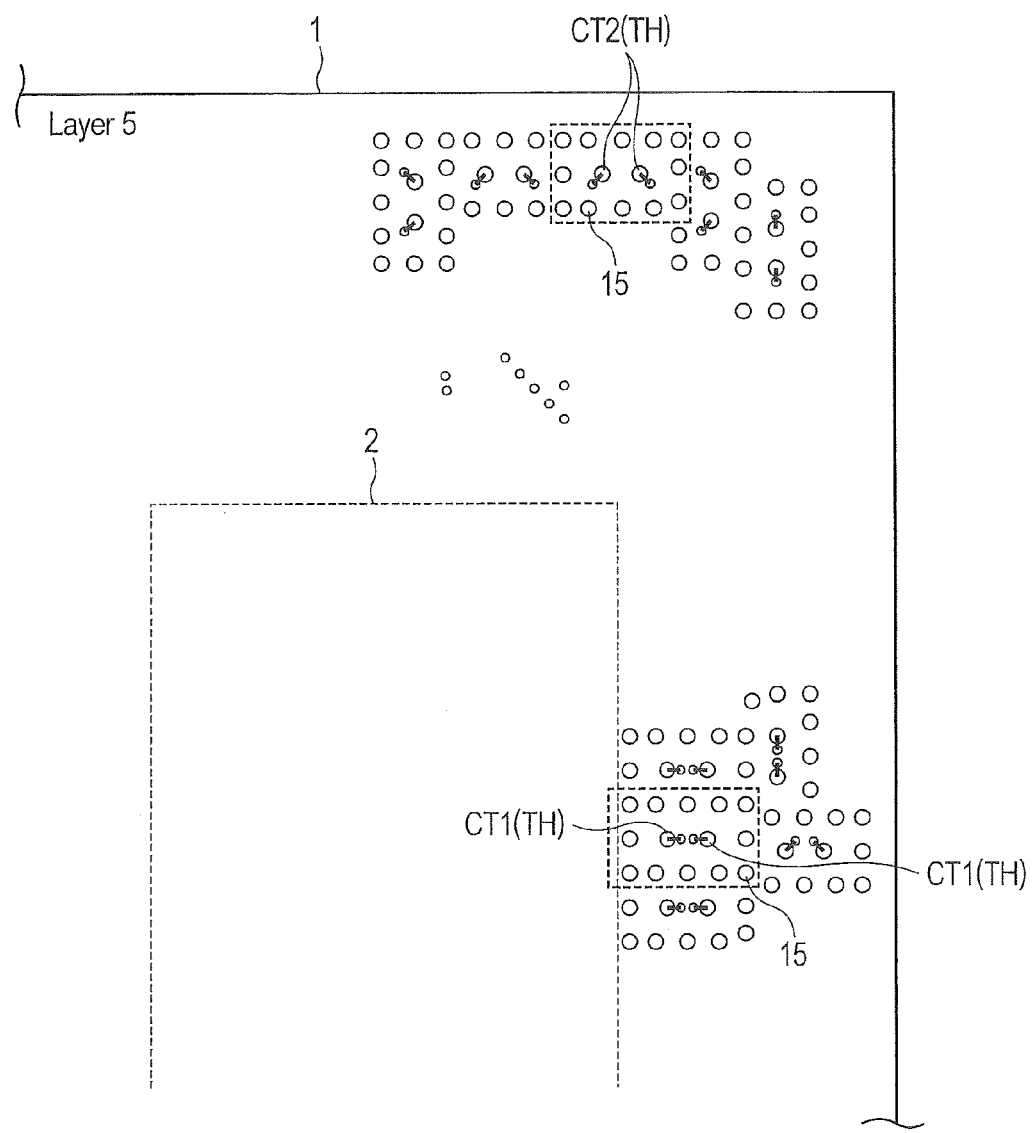
FIG. 14 is a plan view illustrating an interconnect layer: Layer 5.
Figure 15:
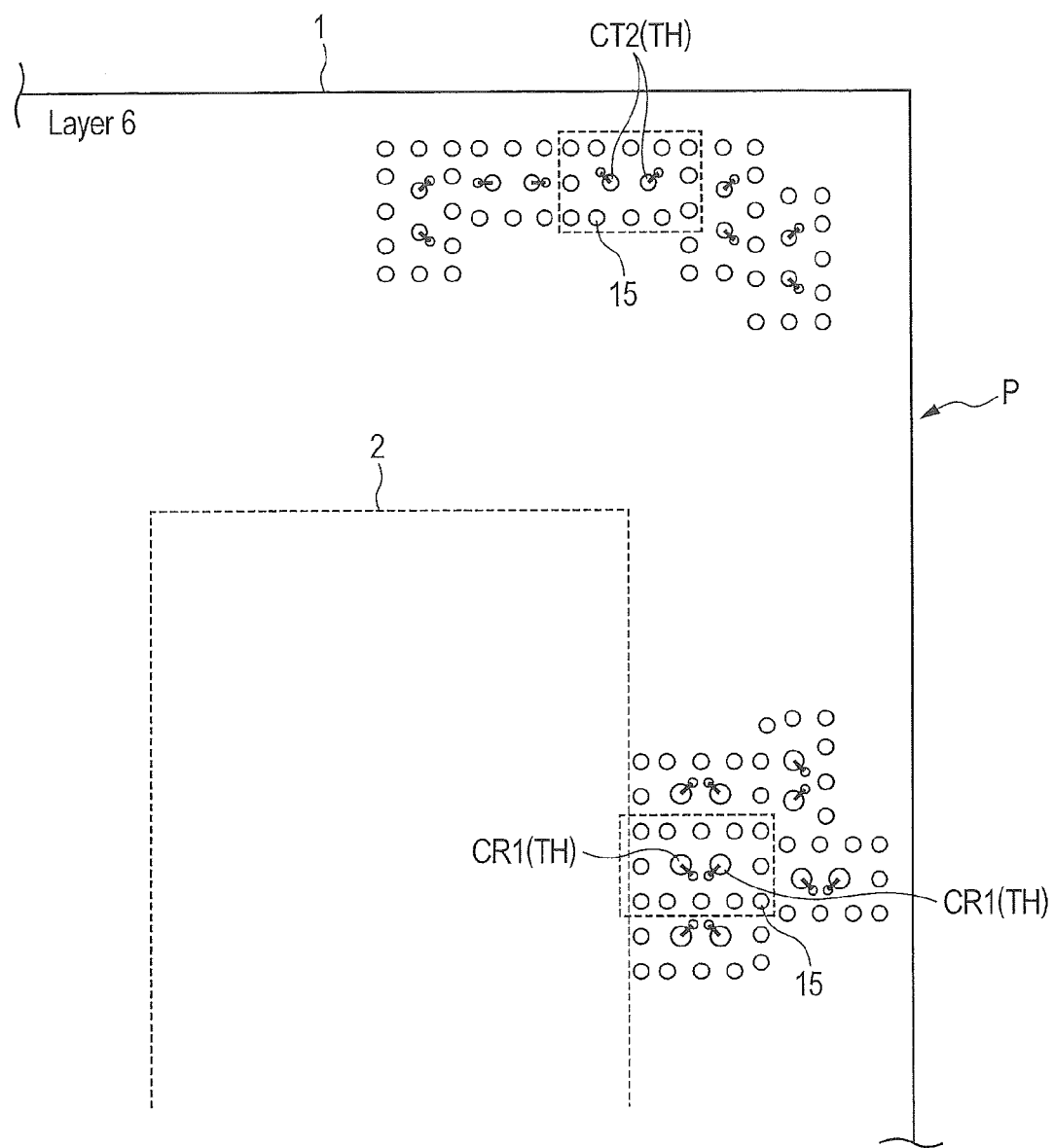
FIG. 15 is a plan view illustrating an interconnect layer: Layer 6.
Figure 16:
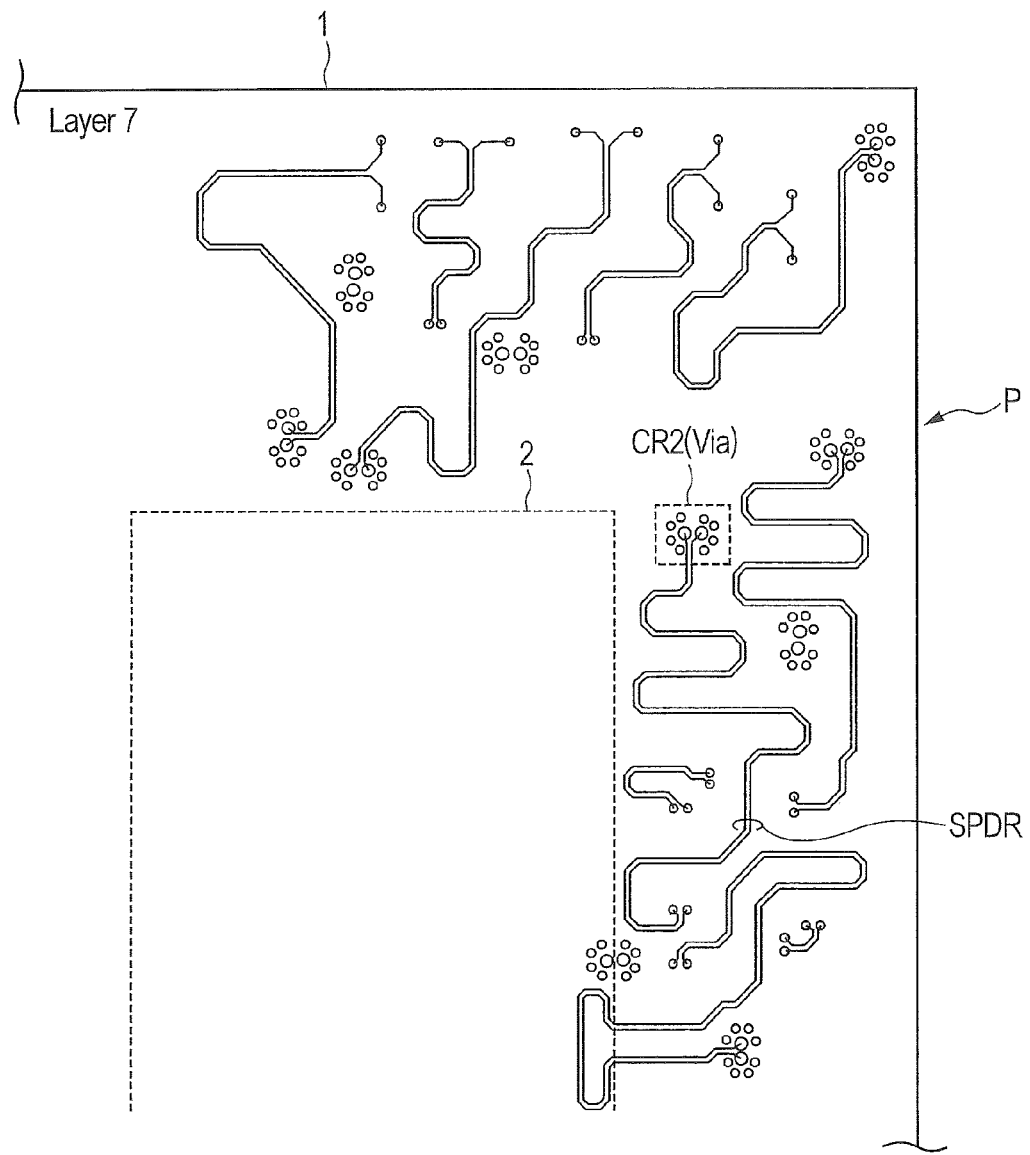
FIG. 16 is a plan view illustrating an interconnect layer: Layer 7.
Figure 17:
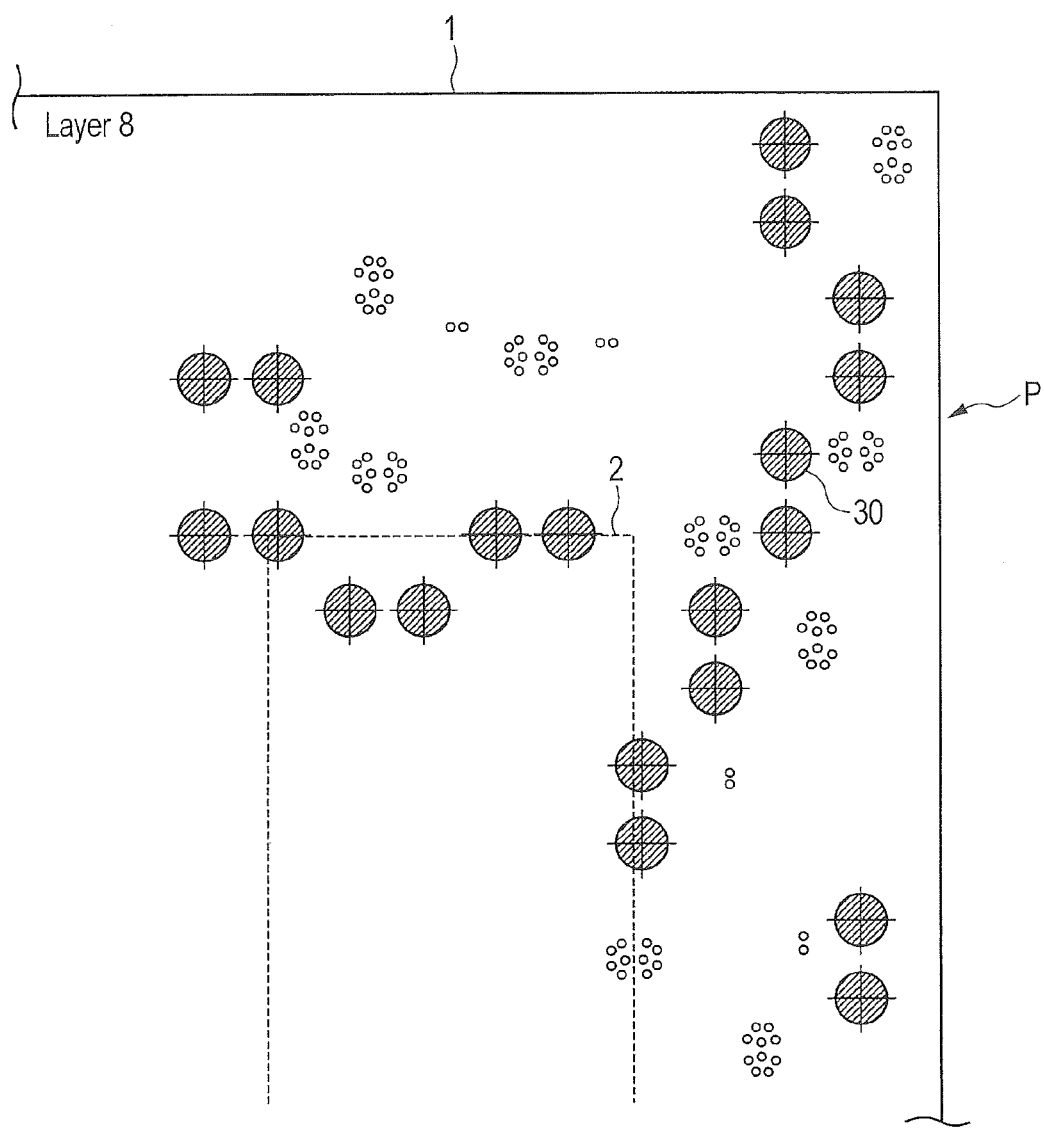
FIG. 17 is a plan view illustrating an interconnect layer: Layer 8.
Figure 18:
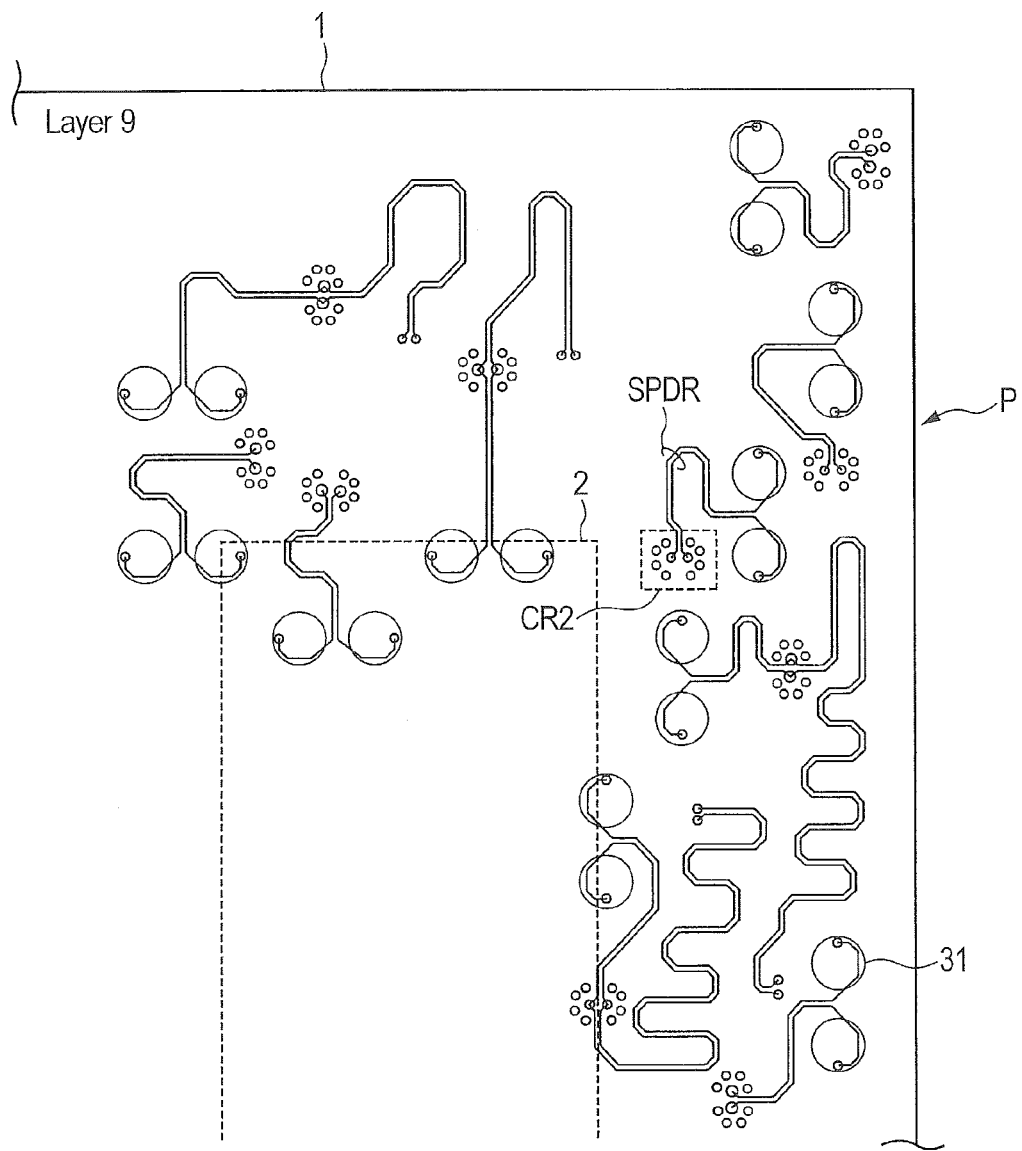
FIG. 18 is a plan view illustrating an interconnect layer: Layer 9.

FIG. 12 illustrates a plan view of an interconnect layer: Layer 2, FIG. 13 illustrates a plan view of an interconnect layer: Layer 4, FIG. 14 illustrates a plan view of an interconnect layer: Layer 5, FIG. 15 illustrates a plan view of an interconnect layer: Layer 6, FIG. 16 illustrates a plan view of an interconnect layer: Layer 7, FIG. 17 illustrates a plan view of an interconnect layer: Layer 8, and FIG. 18 illustrates a plan view of an interconnect layer: Layer 9.

As illustrated in FIG. 12 and FIG. 13, in signal lines SPT1 and SPT2 that form the differential signal line SNDT on the transmission side of the semiconductor chip 2, the matching circuits CT1 disposed in the first stage are formed each by a via passing through between the interconnect layers, i.e., between Layers 2 and 4.

Figure 19:
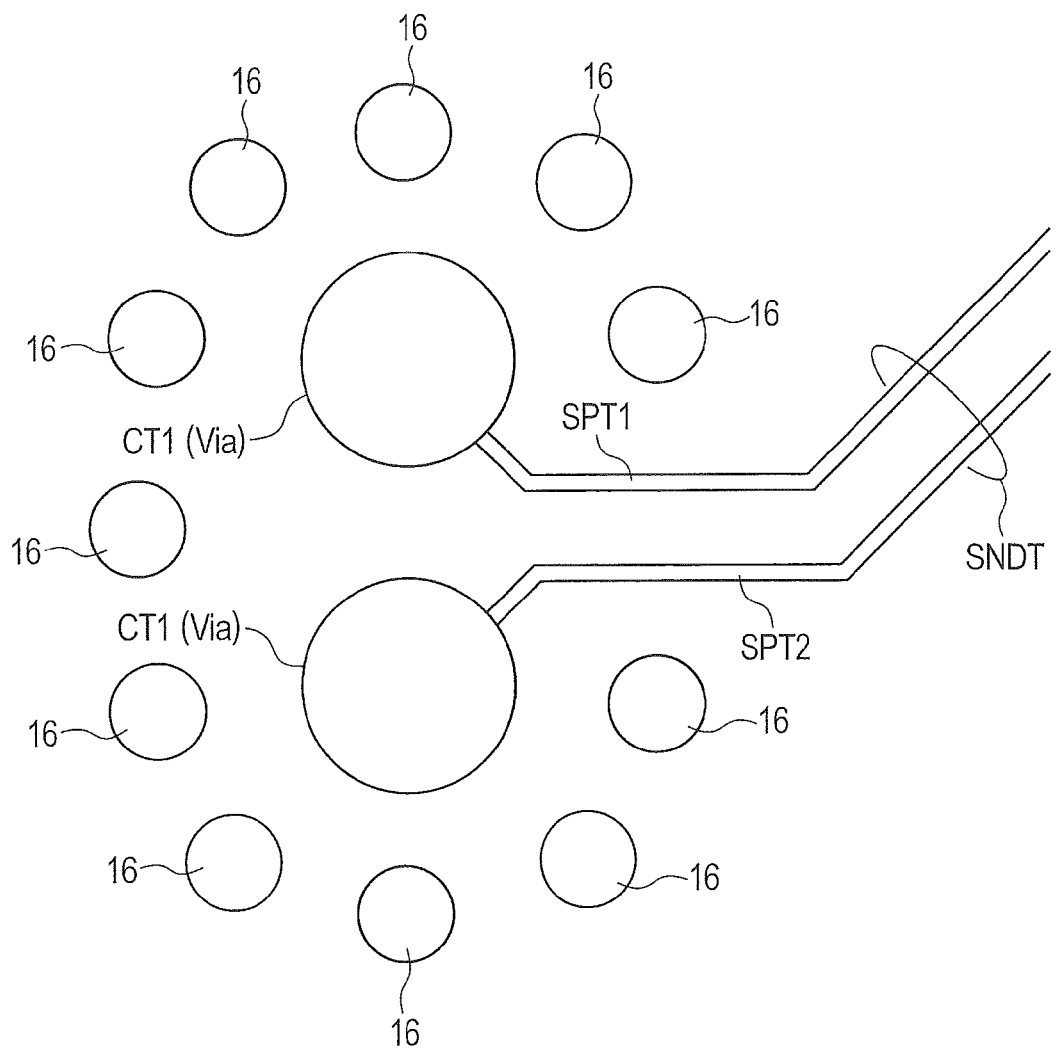
FIG. 19 is an enlarged view for a matching circuit CT1.

FIG. 19 is an enlarged view of the matching circuit CT1. As illustrated in FIG. 19, two signal lines SNT1 and SNT2 that form a differential signal line SNDT are connected to an matching circuit CT1 formed of the via. Further, plural ground vias 16 connected to a ground potential are disposed so as to surround each of the vias that form the matching circuits CT1 of the differential signal line SNDT. Thus, differential signals supplied to the two signal lines SNT1 and SNT2 can be propagated in the vertical direction of the packaging substrate 1 (vertical direction in a cross sectional view).

As illustrated in FIGS. 14 and 15, the matching circuits CR1 disposed in the first stage in the signal lines SPR1 and SPR2 that form the differential signal line SNDR on the receiving side of the semiconductor chip 2 are each formed of through holes that pass through the interconnect layers, i.e., between Layers 5 and 6.

Figure 20:
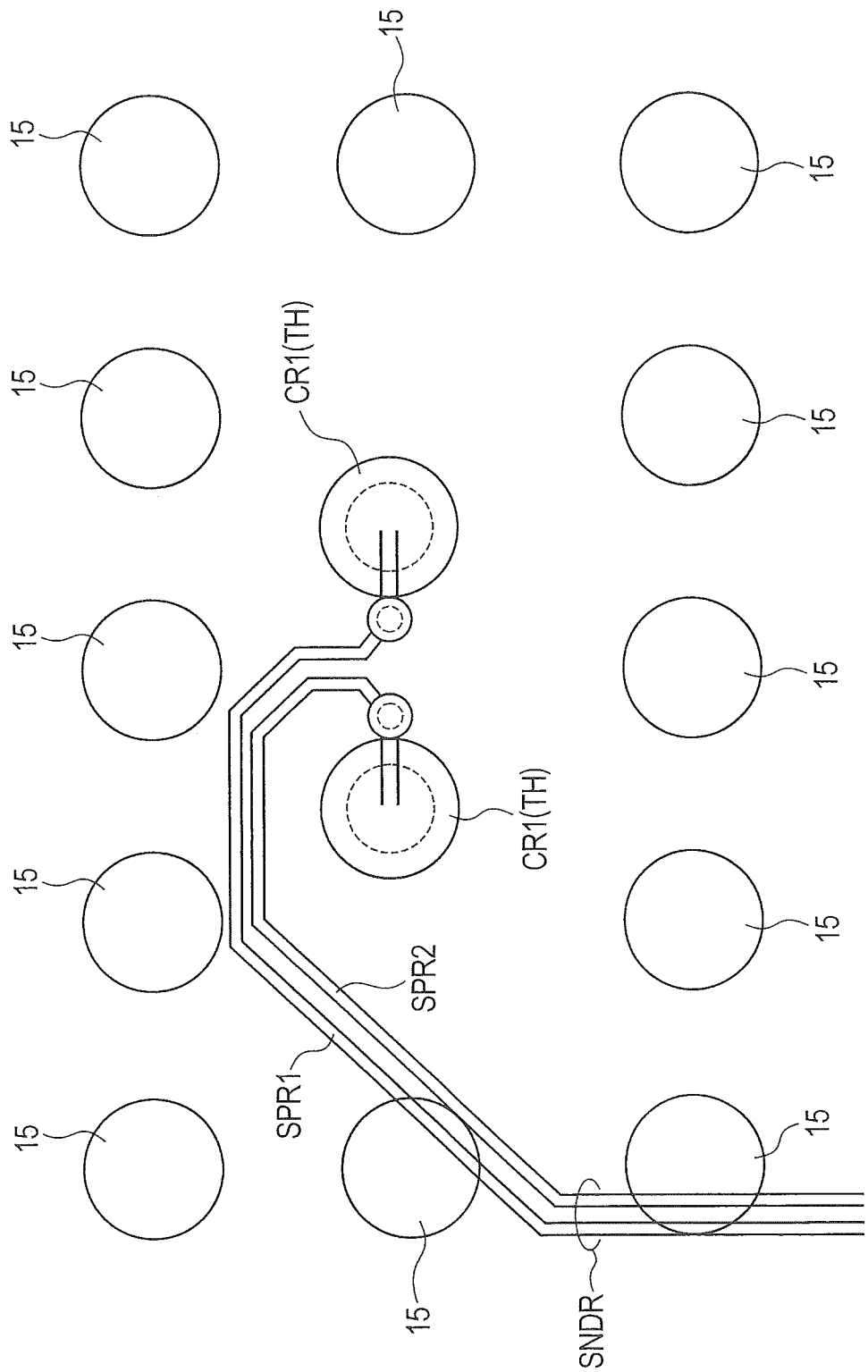
FIG. 20 is an enlarged view for a matching circuit CR1.

FIG. 20 illustrates an enlarged view of the matching circuit CRT1. As illustrated in FIG. 20, two signal lines STR1 and SPR2 that form a differential signal line SNDR are connected to circuits CR1 each formed of a through hole TH. Further, as illustrated in FIG. 20, plural through holes 15 connected to the ground potential are disposed so as to surround each of the through holes that form the matching circuits CR1 of the differential signal line SNDR. Thus, differential signals supplied to the two signal lines SNRT and SNR2 can be propagated in the vertical direction of the packaging substrate 1 (vertical directional in a cross sectional view).

Further, as illustrated in FIG. 14 and FIG. 15, the matching circuits CT2 disposed in the second stage in the differential signal line SNDT on the transmission side of the semiconductor chip 2 are formed of the through holes that pass through the interconnect layers, i.e., between Layers 5 and 6. In the same manner as the matching circuit CR1 described above, plural through holes 15 connected to the ground potential are disposed so as to surround each of the through holes that form the matching circuits CT2 of the differential signal line SNDT.

As illustrated in FIGS. 16 to 18, the matching circuits CR2 disposed in the second stage in the differential signal line SNDR on the receiving side of semiconductor chip 2 are each formed of vias that pass through the interconnect layers, i.e., between Layers 7 and 9. Vias connected with the lands formed in the Layer 7, lands formed in the Layer 8, and the lands formed in the Layer 9 are illustrated as the shape of the via that forms the matching circuit CR2. Further, in the same manner as the matching circuit CT1 described above, plural ground vias 16 connected to the ground potential are disposed so as to surround each of the vias that form the matching circuits CR1 of the differential signal line SNDR.

The diameter of the land connected to the via that forms the matching circuit CR2 in the second stage is made smaller than that of the land connected to the via that forms the matching circuit CT1 in the first stage. This is determined by considering that the level of the signal reflected by the parasitic capacitances CT0, CR0 at input/output ends of the I/O devices Tx1, Rx1, etc. is lowered as it is spaced apart from the input/output ends of the I/O devices Tx1, Rx1, etc. That is, when the capacitance value of the matching circuit in the second stage formed at a position spaced apart farther from the I/O devices Tx1, Rx1, etc. than the matching circuit in the first stage is made smaller than that in the first stage, an effect sufficient to offset the reflection wave reflected at the input/output ends of the I/O devices Tx1, Rx1, etc. can be obtained. Accordingly, by decreasing the capacitance value of the matching circuit CR2 in the second stage further than that of the matching circuit CT1 in the first stage as described above, an area of a region for forming the matching circuit CR2 in the second stage can be decreased. Thus, the density of the matching circuit can be increased and the interconnect density can be decreased further without reducing the effect of suppressing the distortion of the signal waveform by the reflection wave.

Further, as illustrated in FIG. 17 and FIG. 18, a mesh-like metal material 30 that absorbs an electromagnetic wave is formed in the interconnect layer, i.e., Layer 8 just above the opening 31 of the second electrode 11 connected to each of external terminals 8. Since this can reduce the discontinuity of impedance at the second electrode 11 in contact with the external terminal 8 (solder bump), signal transmission characteristics of the differential signal lines SNDR and SNDT can be improved further.

Figure 21:
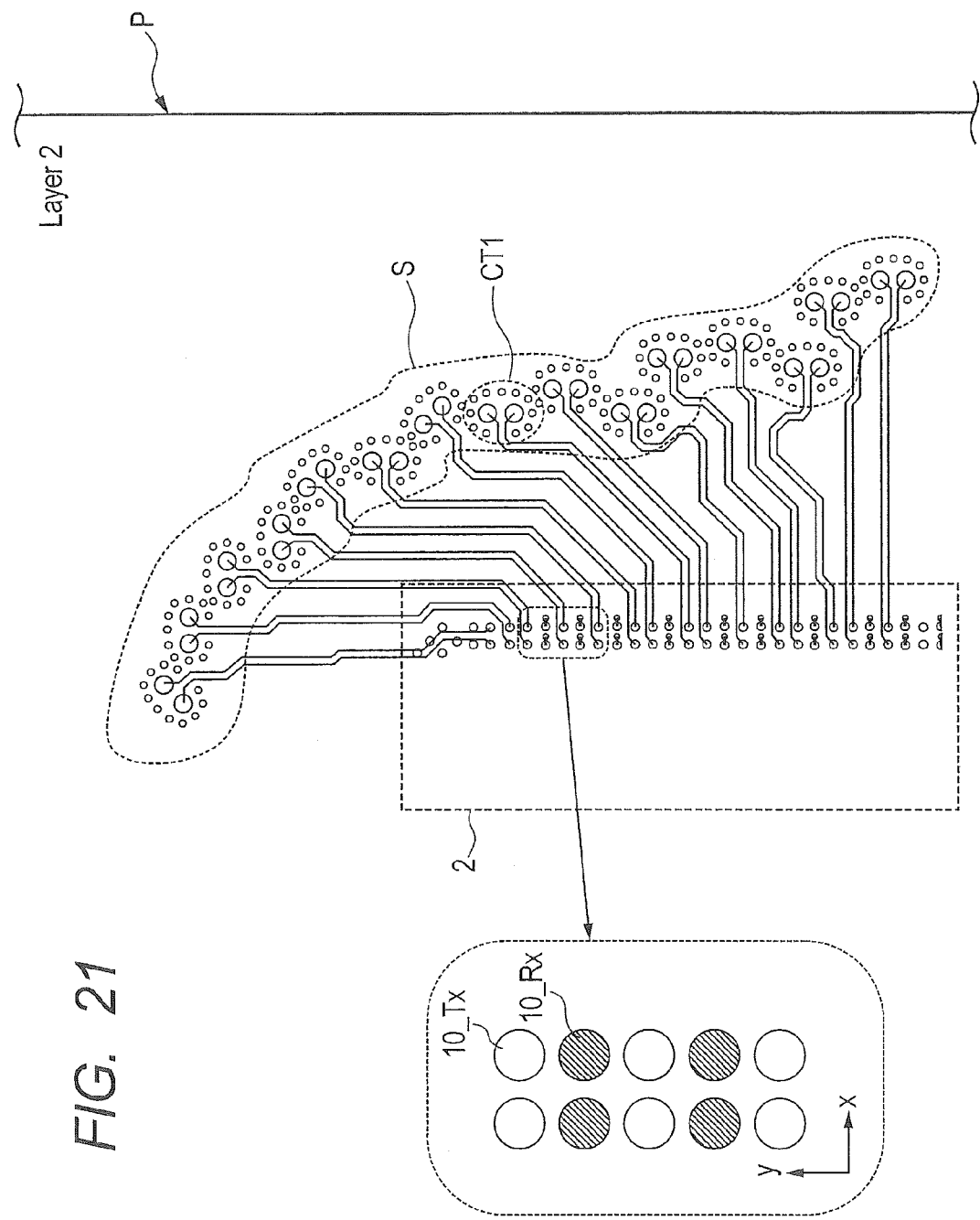
FIG. 21 is a plan view illustrating an interconnect pattern of the interconnect layer: Layer 2.
Figure 22:
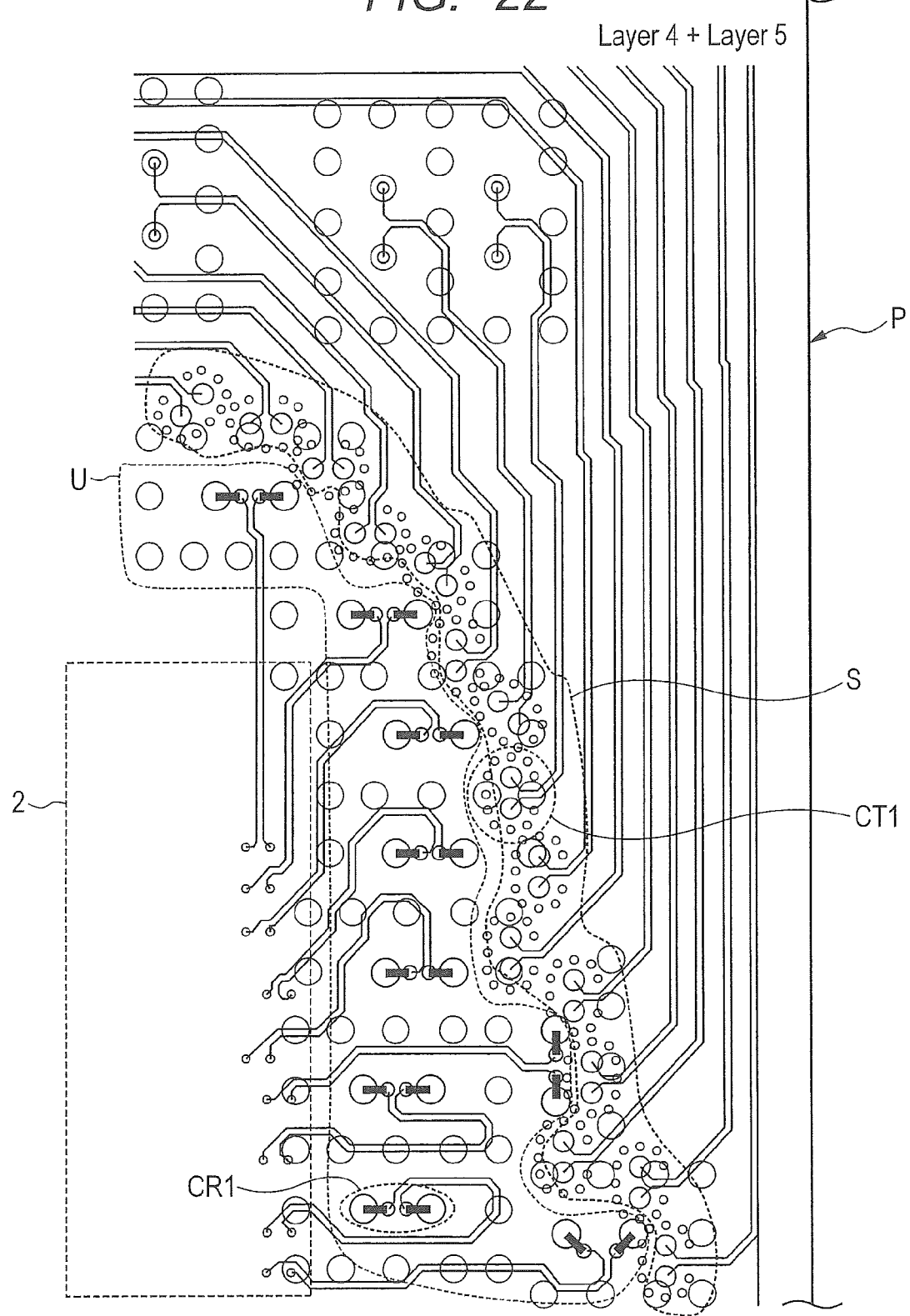
FIG. 22 is a plan view illustrating an interconnect pattern of interlayer layers: Layer 4 and Layer 5.

FIG. 21 and FIG. 22 illustrate an example of an arrangement of the through holes and the vias as the matching circuits on the packaging substrate 11. In the same manner as in FIG. 10, this example shows a case in which the matching circuits CR1 in the first stage of the signal line SNR1 are formed of through holes between the layers 5 and 6, matching circuits CR2 in the second stage are formed of vias between layers 7 and 9, matching circuits CT1 in the first stage of the signal line SNT1 are formed of vias between the Layers 2 and 4, and the matching circuits CT2 in the second stage are formed of the through holes between the Layers 5 and 6.

FIG. 21 is a plan view illustrating an example of an interconnect pattern in the interconnect layer, i.e., Layer 2 and FIG. 22 is a plan view illustrating an example of an interconnect pattern in the interconnect layers, i.e., Layers 4 and 5.

As illustrated in FIG. 21, plural first electrodes 10 are formed in a region just below the semiconductor chip 2 in the packaging substrate 1. Among the plural first electrodes 10, first signal electrodes 10_Rx connected to the output ends of the transmitting I/O devices Tx of the semiconductor chip 2, and second signal electrodes 10_Tx connected to the input ends of the receiving I/O device Rx of the semiconductor chip 2 are arranged orderly. For example, as illustrated in FIG. 21, two first signal electrodes 10_Rx that form the differential pair are disposed being juxtaposed in the direction x and, in the same manner, two signal electrodes 10_Tx that form the differential pair are juxtaposed in the direction x. Then, the differential pair of the first signal electrode 10_Rx and the differential pair of the second signal electrode 10_Tx are arranged alternately on every one set or two sets in the direction y. The arrangement of the first signal electrodes 10_Tx and the arrangement of the second signal electrode 10_Rx are not restricted to that illustrated in FIG. 21 so long as they are entirely or partially arranged orderly.

A plurality of the first signal electrodes 10_Rx are arranged as described above and through holes as the matching circuits CR1 are formed each at a position spaced apart by an interconnect length LR1 from the respective first signal electrodes 10_Rx. Thus the matching circuits CR1 are formed densely in the region S shown in FIG. 21 and FIG. 22.

Further, plural the second signal electrodes 10_Tx are disposed as described above, and vias as the matching circuits CT1 are formed each at a position spaced apart from each of the second signal electrodes 10_Tx by the interconnect length LT1. Thus, the matching circuits CR1 are formed densely in a region U shown in FIG. 22. In FIG. 22, the interconnect length LR1 is made shorter than the interconnect length LT1 within a range of an error (within 20%) of an exact interconnect length ($\lambda/4$) so that the through hole and the via do not overlap in a plan view.

According to FIG. 21 and FIG. 22, it can be understood that more matching circuits are formed at a higher density in the region A over the packaging substrate 1. Further, it can be understood that a group of interconnects connected to the matching circuits are dispersed in plural interconnect layers.

FIG. 23A and FIG. 23B illustrate transmission characteristics of the differential signal line SNDR in a case where the matching circuit CR1 in the first stage is formed of the through hole and the matching circuit CR2 in the second stage is formed of the via. The characteristic graphs are obtained by extracting model parameters from the interconnect patterns in FIG. 12 to FIG. 18 and performing simulation using the model parameter by a three-dimensional electromagnetic field simulator.

FIG. 23A illustrates characteristics of a return loss to a signal frequency in a common mode and FIG. 23B illustrates characteristics of a return loss to a signal frequency in a differential mode. Reference numeral 400 represents a required specification value of the return loss in a common mode of the transmission line at 12.5 GHz and reference numeral 401 represents the return loss of an I/O device RX in the common mode. Reference numeral 402 represents the return loss of the differential signal line SNDR in the common mode when the matching circuits CR1 and CR2 are not disposed and reference numeral 403 represents the return loss of the differential signal line SNDR in the common mode in a case of disposing the matching circuits CR1 and CR2. Further, reference numeral 410 represents a required specification value of the return loss in the differential mode of the transmission line at 12.5 GHz, and reference numeral 411 represents the return loss of the I/O device Rx in the differential mode. Reference numeral 412 represents the return loss of the differential signal line SNDR in the differential mode in a case of disposing the matching circuits CR1 and CR2, and a reference numeral 413 represents the return loss of the differential signal line SNDR in the differential mode in a case of disposing the matching circuits CR1 and CR2.

As can be understood from FIG. 23A and FIG. 23B, good signal transmission characteristics can be attained in a wide band by disposing the matching circuits CR1 and CR2 of the differential signal line SNDR.

Figure 24B:
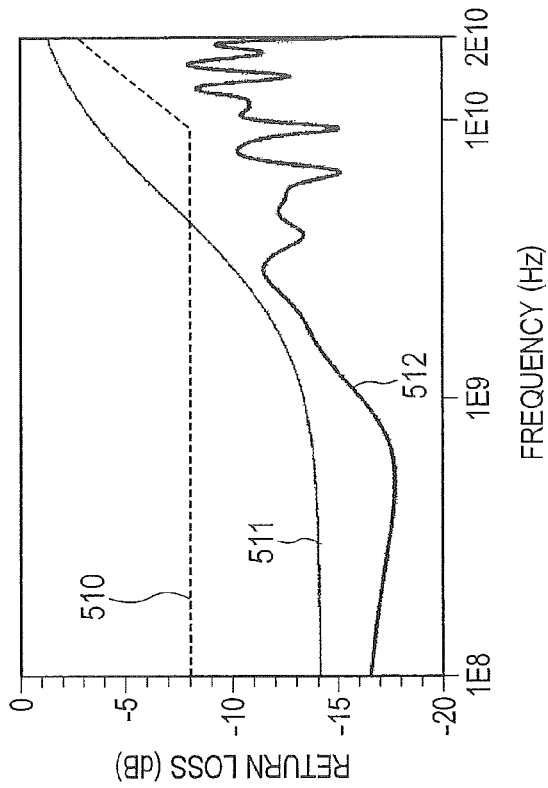
FIG. 24B is a view illustrating transmission characteristics of the differential signal line SNDT in a differential mode in a case of forming a matching circuit CT1 in a first stage by a through hole and forming a matching circuit CT2 in a second stage by a via.
Figure 24A:
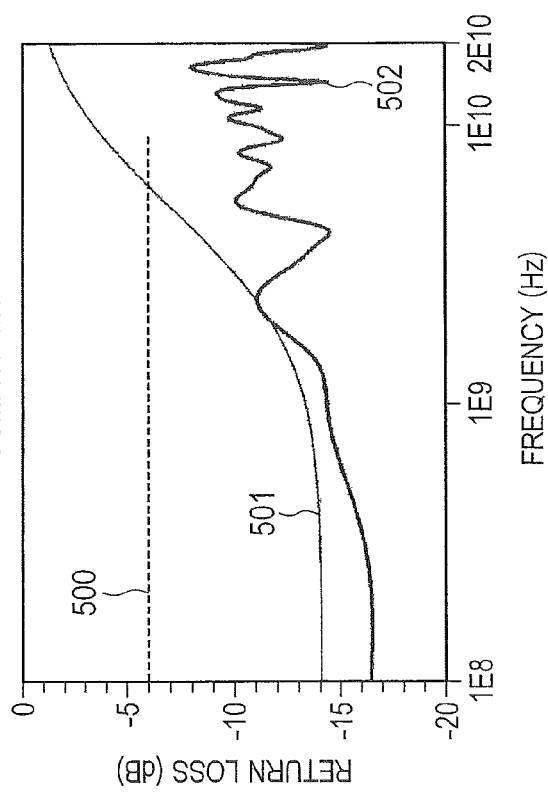
FIG. 24A is a view illustrating transmission characteristics of a differential signal line SNDT in a common mode in a case of forming a matching circuit CT1 in a first stage by a through hole and forming a matching circuit CT2 in a second stage by a via.

FIG. 24A and FIG. 24B illustrate transmission characteristics of a differential signal line SNDT when the matching circuit CT1 in the first stage are formed of vias and the matching circuits CT2 in the second stage are formed of through holes respectively. The characteristic graphs are obtained by simulation using extracted model parameters by a three dimensional electromagnetic field simulator in the same manner as in FIG. 23A and FIG. 23B.

FIG. 24A illustrates characteristics of a return loss to a signal frequency in a common mode and FIG. 24B illustrates characteristics of a return loss to a signal frequency in a differential mode. Reference numeral 500 represents a required specification value of the return loss in the common mode of a transmission line at 12.5 GHz and reference numeral 501 represents the return loss of an I/O device Tx in the common mode. Reference numeral 502 represents a return loss of the differential signal line SNDT in the common mode when the matching circuits CT1 and CT2 are disposed. Further, reference numeral 510 represents a required specification value of the return loss in the differential mode of the transmission line at 12.5 GHz and the reference numeral 511 represents the return loss of the I/O device Tx in the differential mode. Reference numeral 512 represents the return loss of the reference signal line SNDT in the differential mode when the matching circuits CT1 and CT2 are disposed.

As can be understood from FIG. 24A and FIG. 24B, good signal transmission characteristics can be attained in a broad band by providing the matching circuits CT1 and CT2 of the differential signal line SNDT.

A method of manufacturing the semiconductor device 100 is to be described. The semiconductor device 100 is assembled, for example, by the following sequence.

Figure 25:
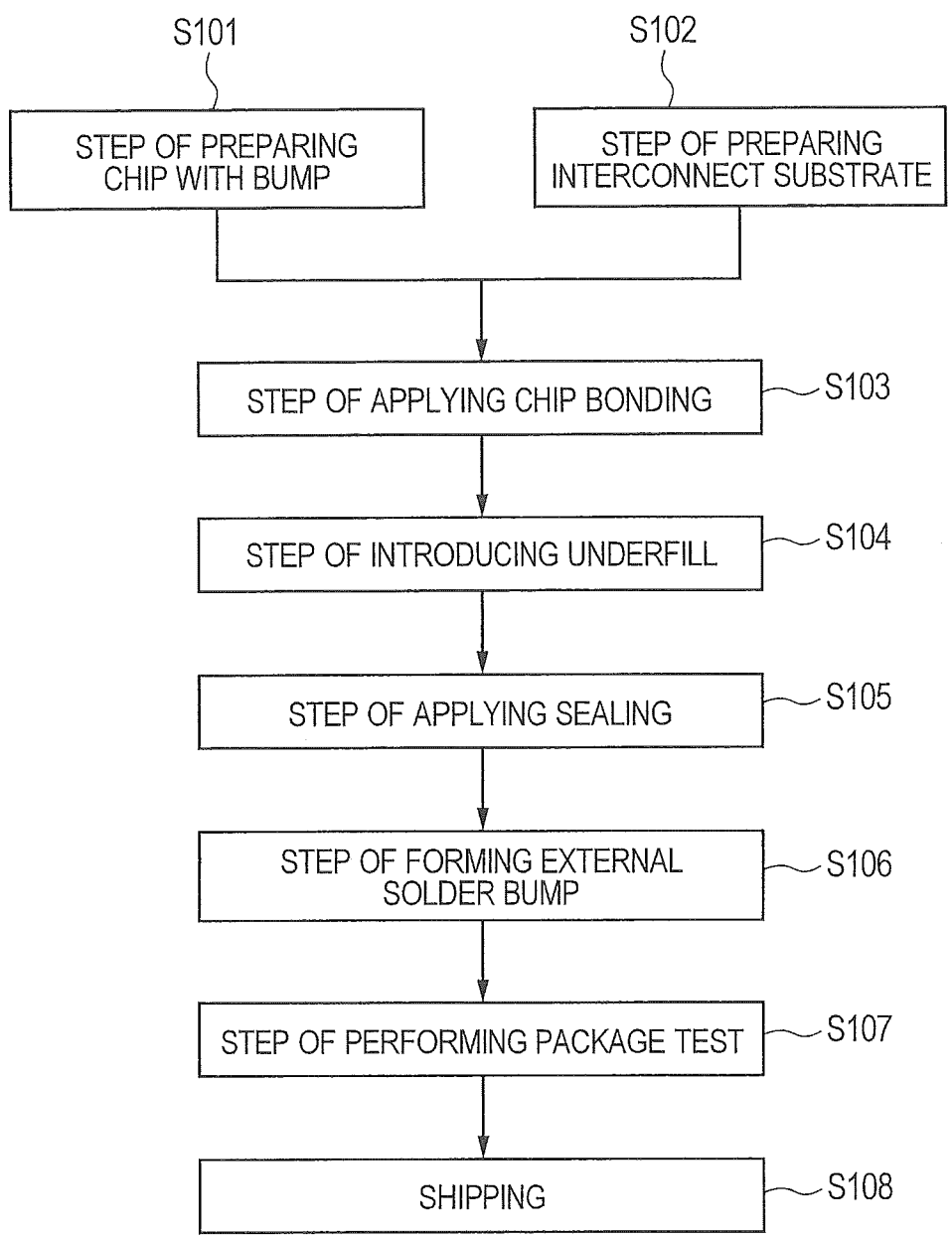
FIG. 25 is a flow chart showing an outline of a production process of the semiconductor device.

FIG. 25 is a flow chart showing an outline of a manufacturing process of the semiconductor device 100.

While the following example is described specifically referring to a process of introducing an underfilling resin after flip chip bonding as an example, it is apparent that the process may comprise mounting of an underfilling resin before flip chip bonding and, subsequently, performing flip chip bonding.

As illustrated in FIG. 25, semiconductor chips 2 and 3 having bumps are provided at first (S101). For example, in a solder bump forming step preceding to the step S101, plural electrode pads (UBM, etc.) are at first provided to the device surface of a wafer having a predetermined circuit pattern formed therein and solder bumps that form the bump electrodes 7 are formed thereon. Then, the wafer is divided into individual chips by way of a wafer probe test step, a bump height inspection step, and a wafer dicing step. Thus, semiconductor chips 2 and 3 with bumps are obtained.

Further, a packaging substrate 1 is prepared (S102). The packaging substrate 1 is obtained by a manufacturing method of stacking substrates each by one layer for upper and lower layers in the step of manufacturing the interconnect substrate preceding to the step 102 and opening through holes or vias on every stacking to ensure electric conduction. The method of manufacturing the packaging substrate 1 is to be described specifically later.

Then, the packaging substrate 1 and the semiconductor chips 2 and 3 are electrically connected by a chip bonding step (flip chip bonding step) (S103). Specifically, in the chip bonding step, electrode pads of the semiconductor chips 2 and 3 and corresponding first electrodes 10 (first signal electrode 10_Rx, second signal electrode 10_Tx, etc.) on the corresponding packaging substrate 1 are connected by way of the bump electrodes 7 by a reflow treatment, for example, at a temperature of about 240° C. to 260° C.

Then, an underfilling resin material 12 is injected between the first main surface (upper surface) 1a of the packaging substrate 1 and the device surface of the semiconductor chip 2 and a curing process is applied (S104). Then, the upper surface of the packaging substrate 1 and the semiconductor chips 2 and 3 are sealed and packaged by a sealing resin material (epoxy) (S105). Then, external solder bumps are attached as external terminals 8 to the second electrodes 11 of the second main surface (lower surface) 1b of the packaging substrate (S106). Then, the semiconductor device 100 packaged by the step described above is subjected to a marking step or the like of marking the upper surface of the sealed body and then to a packaging test (S107), and the semiconductor device 100 passing through a packaging test step is packaged and shipped after an appearance inspection (S108).

Figure 26:
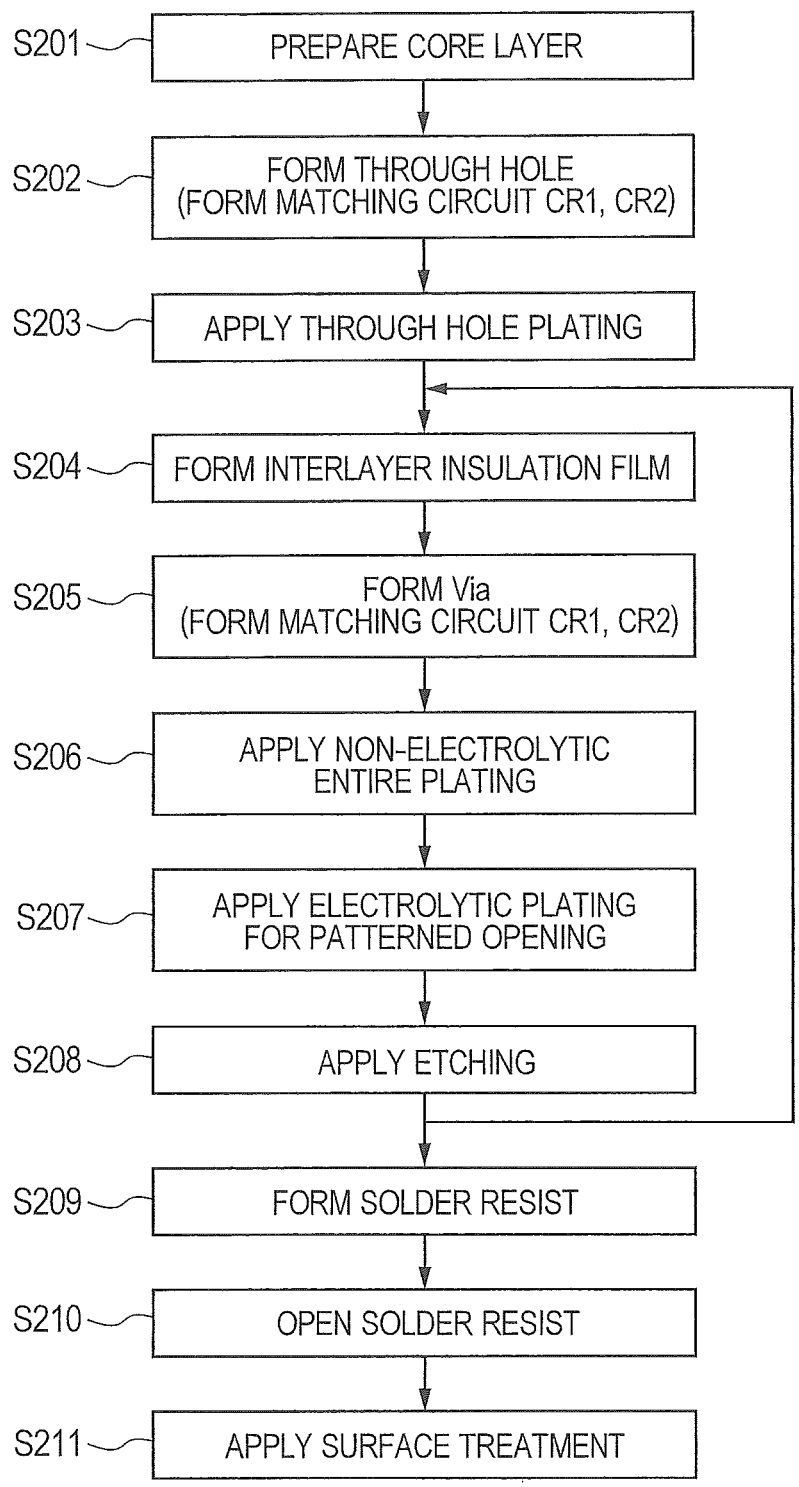
FIG. 26 is a view illustrating an outline of a production process of the packaging substrate.

FIG. 26 illustrates an outline of the manufacturing process of the packaging substrate 1.

As illustrated in FIG. 26, a core substrate 21 in which a copper lined prepreg is bonded to both sides of copper lined plate having an interconnect pattern formed thereon is prepared (S201). Through holes are opened by drilling the core substrate 21 (S202). In this step, through holes that form the matching circuits (CR1, CT2, etc.) are formed in the same manner as usual through holes. Then, plating (non-electrolytic plating or electrolytic plating) is applied to the through holes (S203). Then, buildup layers 20 and 22 are formed. After filling the holes with a resin at first, an interlayer insulation film is formed on both surfaces (S204). Then, vias are formed by laser fabrication (S205). In this steps, vias that form the matching circuits (CR2, CT1, etc.) are formed in the same manner as usual vias. Further, non-electrolytic copper plating is applied at a level of several μm thickness over the entire surface (S206). Then, a dry film resist is patterned into an interconnect pattern by using a photomask, and electrolytic copper plating is applied, for example, at a level of 10 μm thickness in the opened portion (S207). Then, the resist is removed and the plated copper is lightly etched to form an interconnect (S208). Then, the steps S204 to S208 are repeated thereby forming the buildup layers. After forming a required number of interconnect layers in the buildup layers, a solder resist is formed as a surface protection film (S209). Then, first electrodes 10 and second electrodes (solder ball pad) 11 are opened as connection portions (pads) to the semiconductor chip 2 and the packaging substrate 1 (S210). Finally, surface treatment is applied to the opened portions to complete the packaging substrate 1 (S211).

As described above, through holes and vias as the matching circuits can be formed in the same manner as in the case of forming usual through holes and vias in the packaging substrate 1 and no further steps are added.

As described above, according to the semiconductor device 100 and the packaging substrate 1 of the invention, good signal transmission characteristics can be attained while suppressing the manufacturing cost of the packaging substrate.

While the invention made by the present inventors has been described specifically based on the preferred embodiment, it will be apparent that the invention is not restricted only to the embodiment and may be modified variously within the range not departing the gist of the invention.

For example, while an embodiment of forming a matching circuit CR1 (CT1) in the first stage at a position of an interconnect length $\lambda a/4$ has been illustrated, the invention is not restricted to such an embodiment but the same effect can be obtained also by forming the matching circuit CR1 (CT1) in the first stage at a position of an interconnect length $3\lambda a/4$. Further, while an embodiment of forming the matching circuit CR2 (CT2) in the second stage at a position of an interconnect wavelength $3\lambda b/4$ has been illustrated, the invention is not restricted to such an embodiment, but the same effect can be obtained also by forming the matching circuit CR2 (CT2) in the second stage at a position of an interconnect length $\lambda b/4$. For example, in a case where the electromagnetic wavelengths $\lambda a$ and $\lambda b$ (signal frequencies fa and fb) of signals intended to decrease the reflection wave are apart from each other, the matching circuit in the first stage may be formed at a position of $\lambda a/4$ and the matching circuit in the second stage may be formed at a position of $\lambda b/4$. Alternatively, the matching circuit in the first stage may be formed at a position of $3\lambda a/4$ and the matching circuit in the second stage may be formed at a position of $3\lambda b/4$. Further, as the combination of the arrangement of the matching circuits CT2 and CR2, the following patterns may be considered. For example, the combination includes a first pattern in which the matching circuit CT2 is disposed at a position of an interconnect length $3\lambda b/4$ and the matching circuit CR2 is disposed at a position of an interconnect length $3\lambda b/4$ and a second pattern in which the matching circuit CT1 is disposed at a position of an interconnect length $\lambda b/4$ and the matching circuit CR2 is disposed at a position of an interconnect length $\lambda b/4$. The combination also includes a third pattern in which the matching circuit CT2 is disposed at a position of an interconnect length $3\lambda b/4$ and the matching circuit CR2 is disposed at a position of an interconnect length $2\lambda/4$ or a fourth pattern in which the matching circuit CT2 is disposed at a position of an interconnect length $\lambda b/4$ and the matching circuit CR2 is disposed at a position of an interconnect length $3\lambda b/4$. This is applicable also to the matching circuits CR1 and CT1. The pattern to form the matching circuit can be changed variously, for example, depending on the electromagnetic wavelengths $\lambda a$ and $\lambda b$ (signal frequencies fa and fb) of signals intended to decrease the reflection wave, the margin of the region on the packaging substrate 1, etc. For example, when the matching circuits are intended to be disposed densely in a narrow region, the second pattern may be adopted. When the matching circuits are intended to be disposed being dispersed over the interconnect substrate, the third pattern or the fourth pattern may be adopted.

This embodiment shows an example of using through holes for the matching circuits in the first stage using vias for the matching circuits in the second stage of the receiving signal line SNDR, using vias for the matching circuits in the first stage, and using through holes for the matching circuits in the second stage of the transmitting signal line SNDT. However, the invention is not restricted to such configuration. For example, the vias may be used as the matching circuits in the first stage and the through holes may be used as the matching circuits in the second stage of the receiving signal line SNDR, and the through holes may be used as the matching circuits in the first stage and the vias may be used as the matching circuits in the second stage of the transmitting signal line SNDT. Further, in a case where the semiconductor device 100 has only the transmitting I/O device, it may be configured to use the through holes as an the matching circuits in the first stage and use the vias as the matching circuits in the second stage for a portion of the signal lines and use the vias as the matching circuits in the first stage and use the through holes as the matching circuits in the second stage for other portion of the signal lines among the plural transmitting signal lines connected therewith, and vice versa. This is applicable also to a case where the semiconductor device 100 has only the receiving I/O device.

While the embodiment shows an example in which the matching circuits are formed in two stages to the signal line on the packaging substrate 1, the invention is not restricted to such an example and the number of stages can be changed in accordance with a required specification. For example, the matching circuits may be provided in one stage or in three or more stages. Also for the matching circuits at or after the third stages, the matching circuits may be disposed with reference to $\lambda/4$ or $3\lambda/4$ in the same manner as in the first stage and the second stage.

While this embodiment illustrates an example of forming the matching circuits CR1, etc. on the packaging substrate 1 for impedance matching of the signal line that connects the bump electrode 7 and the external terminal 8 in the signal line that connects the semiconductor device 100 and another semiconductor device 101, the invention is not restricted to such example. For example, for impedance matching of the signal line that connects the bump electrode 7 of the semiconductor chip 2 and the bump electrode 13 of the semiconductor chip 3, matching circuits can be formed by through holes or vias on the packaging substrate 1 in which the signal line is formed.

What is claimed is:

1. A semiconductor device comprising a semiconductor chip and an interconnect substrate having the semiconductor chip mounted thereon,
   wherein the interconnect substrate comprises:
   a first main surface formed with a plurality of first electrodes connected electrically to the semiconductor chip;
   a second main surface opposing the first main surface; and
   an interconnect region interposed between the first main surface and the second main surface,
   wherein the first electrodes includes a plurality of first signal electrodes and second signal electrodes arranged orderly for receiving supply of signals each at a predetermined frequency, and
   wherein the first signal electrodes and the second signal electrodes are disposed being dispersed in the arrangement thereof, and
   wherein the interconnect region includes:
   a core substrate;
   a plurality of interconnect layers formed on both surfaces of the core substrate respectively;
   a plurality of first through holes that pass through the core substrate for forming impedance matching capacitance;
   a plurality of first vias that pass through the interconnect layer formed to the core substrate on the side of the first main surface for forming impedance matching capacitances;
   a plurality of first signal interconnects connected to the corresponding first signal electrodes; and
   a plurality of second signal interconnects connected to the corresponding second signal electrodes,
   wherein each first through hole is connected to the first signal interconnect at a position spaced apart from the first signal electrode by a first interconnect length, and
   wherein the first via is connected to the second signal interconnect at a position spaced apart from the second signal electrode by a second interconnect length that is substantially equal with the first interconnect length.

2. The semiconductor device according to claim 1,
   wherein the interconnect region further includes:
   a plurality of second through holes passing through the core substrate for forming impedance matching capacitances; and
   a plurality of second vias passing through the interconnect layer formed to the core substrate on the side of the second main surface for forming the impedance matching capacitances,
   wherein each second through hole is connected with the second signal interconnect at a position spaced apart from the second signal electrode by a third interconnect length longer than the first interconnect length, and
   wherein each second via is connected with the first signal interconnect at a position spaced apart from the first signal electrode by a fourth interconnect length that is substantially equal with the third interconnect length.

3. The semiconductor device according to claim 2, wherein the first interconnect length is a length corresponding to ¼ of an electromagnetic wavelength in accordance with a first frequency in a signal band required for a transmission line of the signal.

4. The semiconductor device according to claim 3, wherein the third interconnect length is a length corresponding to ¾ of an electromagnetic wavelength in accordance with a second frequency that is different from the first frequency in a signal band required for the transmission line of the signal.

5. The semiconductor device according to claim 2, wherein the first interconnect length is a length corresponding to ¾ of the electromagnetic wavelength corresponding to the first frequency in a signal band required for the transmission line of the signal.

6. The semiconductor device according to claim 2, wherein the first through hole and the first via do not overlap in a plan view.

7. The semiconductor device according to claim 2, wherein the first signal interconnect is a first differential interconnect pair formed by two interconnects in parallel and the second signal interconnect is a second differential interconnect pair formed by two interconnects in parallel.

8. The semiconductor device according to claim 2, wherein one of the first signal electrode and the second electrode is a receiving electrode for inputting a signal to the semiconductor chip and the other of them is a transmitting electrode for outputting a signal from the semiconductor chip.

9. The semiconductor device according to claim 2, wherein the diameter of the uppermost land and the diameter of the lowermost land connected to the first through hole are different in a cross sectional view.

10. The semiconductor device according to claim 2, wherein
the first through hole is connected with a plurality of lands in a vertical direction in a cross sectional view.

11. The semiconductor device according to claim 2, wherein
the diameter of the uppermost land and the diameter of the lowermost land connected to the first via are different in a cross sectional view.

12. The semiconductor device according to claim 2, wherein
a plurality of lands are connected in a vertical direction to the first via in a cross sectional view.

13. The semiconductor device according to claim 2, wherein
a portion of a plurality of the first vias is connected by way of one land to the second signal interconnect and a remaining portion of them is connected to the second signal interconnect by way of a plurality of lands.

14. The semiconductor device according to claim 2, wherein
the diameter of the land for the first via is larger than that for the second via.

15. The semiconductor device according to claim 2, wherein
the first via has a larger land diameter than that of the adjacent via for connecting adjacent interconnect layers to each other.

16. The semiconductor device according to claim 2, wherein
the semiconductor chip has a plurality of interface buffers connected being corresponded respectively to the first signal terminal and second signal terminal.

17. A semiconductor device according to claim 16, further comprising:
a plurality of external terminals,
wherein the second main surface comprises a plurality of second electrodes connected electrically to the corresponding external terminals,
wherein the first signal interconnect forms a transmission line electrically connecting the first signal electrode and the corresponding second electrode, and
wherein the second signal interconnect forms a transmission line electrically connecting the second signal electrode and the corresponding second electrode.

18. An interconnect substrate comprising:
a main surface formed with a plurality of first electrodes for electric connection with a semiconductor chip;
a second main surface opposing the first main surface; and
an interconnect region interposed between the first main surface and the second main surface,
wherein a first electrode includes a plurality of first signal electrodes and second signal electrodes arranged orderly for receiving supply of signals at a predetermined frequency,
wherein the first signal electrode and the second signal electrode are disposed being dispersed in the arrangement thereof,
wherein the interconnect region includes:
a core substrate;
a plurality of interconnect layers formed respectively on both surfaces of the core substrate;
a plurality of first through holes that pass through the core substrate for forming impedance matching capacitances;
a plurality of first vias that pass through the interconnect layer formed to the core substrate on the side of the first main surface for forming impedance matching capacitances;
a plurality of first signal interconnects connected to the corresponding first signal electrodes; and
wherein a plurality of second signal interconnects connected to the corresponding second signal electrodes,
wherein each first through hole is connected to the first signal interconnect at a position spaced apart from the first signal electrode by a first interconnect length, and
wherein the first via is connected to the second signal interconnect at a position spaced apart from the second signal electrode by a second interconnect length that is substantially equal with the first interconnect length.

19. The interconnect substrate according to claim 18,
wherein the interconnect region further includes:
a plurality of second through holes that pass through the core substrate for forming impedance matching capacitances; and
a plurality of second vias that pass through the interconnect layer formed to the core substrate on the side of the second main surface for forming impedance matching capacitances,
wherein each second through hole is connected to the second signal interconnect at a position spaced apart from the second signal electrode by a third interconnect length longer than the first interconnect length, and
wherein each second via is connected to the second signal interconnect at a position spaced apart from the first signal electrode by a fourth interconnect length that is substantially equal with the third interconnect length.

20. A semiconductor device comprising:
a semiconductor chip; and
an interconnect substrate having the semiconductor chip mounted thereon,
wherein the interconnect substrate includes:
a first main surface electrically connected with the semiconductor chip and formed with a plurality of signal electrodes supplied with signals at a predetermined frequency;
a second main surface opposing the first main surface; and
an interconnect region interposed between the first main surface and the second main surface,
wherein the interconnect region includes:
a core substrate;
a plurality of interconnect layers formed respectively on both surfaces of the core substrate;
a plurality of signal interconnects formed in the interconnect layer and extended from the signal electrodes; and
a plurality of impedance matching circuits connected to the signal interconnect each at a position spaced apart from the signal electrode by a predetermined interconnect length,
wherein a portion of the plurality of impedance matching circuits is formed of a plurality of through holes that pass through the core substrate and a remaining portion thereof is formed of a plurality of vias that pass through the interconnect layer formed to the core substrate on the side of the first main surface.

* * * * *